United States Patent
Suzuki

Patent Number: 6,151,240
Date of Patent: *Nov. 21, 2000

[54] FERROELECTRIC NONVOLATILE MEMORY AND OXIDE MULTI-LAYERED STRUCTURE

[75] Inventor: Masayuki Suzuki, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/655,943

[22] Filed: May 31, 1996

[30] Foreign Application Priority Data

| Jun. 1, 1995 | [JP] | Japan | 7-158521 |
| Jun. 5, 1995 | [JP] | Japan | 7-161422 |
| Jun. 12, 1995 | [JP] | Japan | 7-169266 |

[51] Int. Cl.[7] ................. G11C 11/22
[52] U.S. Cl. ............ 365/145; 257/295
[58] Field of Search .......... 365/145, 65, 117, 365/87; 257/295

[56] References Cited

U.S. PATENT DOCUMENTS

| 4,713,157 | 12/1987 | McMillan et al. | 204/192.11 |
| 5,168,420 | 12/1992 | Ramesh et al. | 505/1 |
| 5,248,564 | 9/1993 | Ramesh | 428/688 |
| 5,324,714 | 6/1994 | Inam et al. | 365/145 X |
| 5,439,877 | 8/1995 | Face | 505/475 |
| 5,548,475 | 8/1996 | Ushikubo et al. | 365/145 X |
| 5,604,145 | 2/1997 | Hashizume | 437/52 |
| 5,638,319 | 6/1997 | Onishi et al. | 365/145 |

*Primary Examiner*—A. Zarabian
*Attorney, Agent, or Firm*—Hill & Simpson

[57] ABSTRACT

A ferroelectric memory includes a silicon substrate having a buffer layer on the substrate and a conductive oxide thin film on the buffer layer. A bismuth based layered ferroelectric oxide thin film is formed on the conductive oxide and a further conductive layer is formed on the ferroelectric layer. In one embodiment, the buffer layer is substantially lattice matched with the silicon substrate, the conductive oxide thin film is substantially lattice matched with the buffer layer, and the bismuth-based layered ferroelectric oxide thin film is substantially lattice matched with the conductive oxide thin film. Additionally, the invention includes the use of a super-lattice structure for the ferroelectric layer.

104 Claims, 11 Drawing Sheets t ≈ 1 μm $t \approx 100nm$ t ≤ 50nm

FERROELECTRIC NONVOLATILE MEMORY AND OXIDE MULTI-LAYERED STRUCTURE

BACKGROUND OF THE INVENTION

1. Field of the Invention

This invention relates to ferroelectric nonvolatile memory and an oxide multi-layered structure.

2. Related Art

Studies on materials of oxide thin films started from high temperature superconducting oxide ((1) Z. Phys. B., 64, 189–193 (1986)), and have been developed dramatically in a few years.

Memory devices using ferroelectric materials were extensively studied once in the 1950s but did not spread into the industry because of the difficulty of interface control of ferroelectric thin films. Recently, however, ferroelectric nonvolatile memory (for example, (2) Electrical Engineering, 71, 916–922 (1952), (3) Bell Labs. Record, 33, 335–342 (1955)) has attracted attention and has been under rapid development (for example, (4) Appl. Phys. Lett., 48, 1439–1440 (1986), (5) U.S. Pat. No. 4,713,157, (6) IEDM Tech. Dig., 850–851 (1987), (7) IEEE J. Solid State Circuits, 23, 1171–1175 (1988), (8) Tech. Dig. ISSCC 88, 130–131 (1988)). The present status of ferroelectric nonvolatile memory is reported in detail (for example, (9) Oyo Buturi (Applied Physics), 62, No. 12, 1212–1215 (1993), (10) Electronic Ceramics, 24, No. 7, 6–10 (1993), (11) Denshi Zairyo (Electronic Parts and Materials), 33, No. 8, Application for nonvolatile memory by ferroelectric thin films, special edition (1994), (12) Ceramics Japan, 27, 720–727 (1992)).

Many of ferroelectric nonvolatile memory devices heretofore reported have a structure in which a ferroelectric oxide thin film having a perovskite crystal structure is interposed between a pair of Platinum (Pt) electrodes (for example, (13) J. Appl. Phys., 70, 382–388 (1991)). In typical ferroelectric nonvolatile memory, a PZT thin film is made between a pair of Pt electrodes. However, Pt electrodes are liable to peel off, and the fatigue property indicative of the aging of the memory is bad in most cases. It is presumed that these problems are caused by complex mixture of various factors, such as oxygen defects in the PZT thin film near the interface with the Pt electrode, and a fatigue in coupling force due to a large spontaneous polarization value, i.e. a large displacement in the lattice (for example, (14) J. Appl. Phys., 70, 382–388 (1991)).

In order to improve the fatigue property of ferroelectric nonvolatile memory, the use of a bismuth (Bi) layered ferroelectric oxide thin film as ferroelectric thin film has been proposed (for example, (15) PCT International Publication WO93/12538, (16) PCT International Publication WO93/12542)).

However, according to the knowledge of the Inventor, ferroelectric nonvolatile memory heretofore proposed is not satisfactory in optimization of the structure.

OBJECT AND SUMMARY OF THE INVENTION

It is therefore a primary object of the invention to provide novel ferroelectric nonvolatile memory enabling optimization of the structure.

Another object of the invention is to provide a novel oxide multi-layered structure enabling realization of ferroelectric nonvolatile memory with an optimum structure.

To attain the objects, the present Inventor made a detailed review of optimum materials and other factors for realizing ferroelectric nonvolatile memory, and its result is summarized below.

The most promising candidate for the substrate is single crystal silicon which is economical, readily available and excellent in crystallinity.

With regard to electrode materials, conductive oxides, in particular, having a perovskite crystal structure are considered excellent for removing problems involved in conventional ferroelectric nonvolatile memory using Pt electrodes. Among these conductive oxides, typical examples of simple perovskite oxides expressed by the general formula $ABO_3$ are shown below.

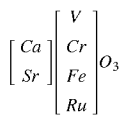

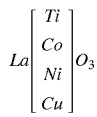

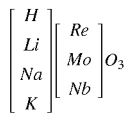

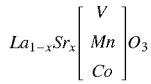

($x > 0.23$)

$BaPbO_3$

An example of pyrochlore conductive oxides expressed by the general formula $A_2B_2O_7$ is:

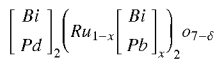

Among conductive oxides, layered perovskite oxides include:

$Ca_{n+1}Ti_nO_{3n+1}$ $(SrXO_3)(SrO)_n$ $n = 0, \frac{1}{3}, \frac{1}{2}, 1$ $X = Ru, Ir, Cr, ...$ Their particular examples are $SrRuO_3$, $SrIrO_3$, $Sr_2RuO_4$, and $Sr_2IrO_4$.

Layered perovskite oxides further include, for example, $Ba_2RuO_4$.

Candidates for electrode materials other than those shown above include high temperature superconducting oxides. Specific examples are:

$(La_{1-x}Sr_x)_2CuO_4$

[$x \leq 0.3$]

$(Nd_{1-x}Ce_x)_2CuO_{4-\delta}$

[$x \leq 0.1$]

-continued $YBa_2Cu_3O_{7-\delta}$ $Bi_2Sr_2Ca_{n-1}Cu_nO_{2n+4}$
$[n \leq 4]$ $Tl_mBa_2Ca_{n-1}Cu_nO_{2n+4}$
$[m = 1 \text{ or } 2, n \leq 5]$ When the aforementioned conductive oxides are used to make the electrode, it is usually difficult to epitaxially grow these conductive oxides directly on a silicon substrate. A solution is to first make a buffer layer on the silicon substrate by epitaxially growth of a material in lattice-matching with the silicon substrate and then epitaxially grow on the buffer layer a conductive oxide thin film in lattice-matching with the buffer layer. The use of the buffer layer permits choice of the most suitable electrode material among a wider range of conductive oxides. The buffer layer is preferably an oxide to permit epitaxial growth of a conductive oxide thin film thereon. The oxide buffer layer must be one that can be epitaxially grown directly on the silicon substrate.

There are many oxide materials as shown in Table 1. Among them, only five kinds of oxides, magnesium oxide (MgO), Cerium oxide (ceria) (CeO$_2$), α-alumina (α-Al$_2$O$_3$), yttrium stabilized zirconia (YSZ) and magnesium aluminate spinel (MgAl$_2$O$_4$), are known as being epitaxially grown directly on a silicon substrate. However, it has not been proved that other oxides cannot be epitaxially grown directly on a silicon substrate, and there would be some that can be made by direct epitaxial growth on a silicon substrate. Table 1 shows lattice constants (a, c) and thermal expansion coefficients (a) of oxide crystals. The lattice constant and thermal expansion coefficient of Si are a=0.5430884 nm and α=3.0×10$^{-6}$/K.

TABLE 1

| oxide crystal | lattice constant [nm] | α[10$^{-6}$/K] | direct epitaxial growth |
|---|---|---|---|
| MgO | a = 0.4213 | 13.5 | ○ |
| TiO$_2$ | a = 0.4593 c = 0.2959 | 7.14(a) 9.19(c) | |
| CeO$_2$ | a = 0.5411 | — | ○ |
| α-Al$_2$O$_3$ | a = 0.476 c = 1.299 | 7.5 | ○ |
| YSZ | a = 0.514 (a$_p$ = 3.63) | 10.3 | ○ |
| SrTiO$_3$ | a = 0.3905 | 11.1 | |
| SrTiO$_3$:Nb | a = 0.3905 | 11.1 | |
| YAlO$_3$ | a = 0.5179 b = 0.5329 c = 0.7370 | 10 | |
| LaAlO$_3$ | a = 0.5377 | 12.6 | |
| NdAlO$_3$ | a = 0.3752 | — | |
| MgAl$_2$O$_4$ | a = 0.8083 | 5.9 | ○ |
| LaGaO$_3$ | a = 0.5521 b = 0.5485 c = 0.777 | 12.1 | |
| NdGaO$_3$ | a = 0.5417 b = 0.5499 c = 0.7717 | 7.8 | |
| PrGaO$_3$ | a = 0.5449 b = 0.5487 c = 0.7719 | 9.0 | |
| LaSrGaO$_4$ | a = 0.3843 c = 1.2681 | 10.05(a) 18.94(c) | |
| PrSrGaO$_4$ | a = 0.3823 c = 1.2578 | — | |
| NdCaAlO$_4$ | a = 0.369 c = 1.215 | — | |
| Sr$_2$AlTaO$_6$ | a = 0.7795 | — | |
| SrRuO$_3$ | a = 0.5567 b = 0.5530 c = 0.7845 | — | |
| CaRuO$_3$ | a = 0.536 b = 0.553 c = 0.777 | — | |
| LaNiO$_3$ | a = 0.383 | — | |
| La$_{0.5}$Sr$_{0.5}$CoO$_3$ | a = 0.384 | — | |
| LiNbO$_3$ | a = 0.51494 c = 1.38620 | — | |
| (NdCe)$_2$CuO$_4$ | a = 0.395 c = 1.21 | — | |
| (LaSr)$_2$CuO$_4$ | a = 0.377 c = 1.32 | 13.8 | |

TABLE 1-continued

| oxide crystal | lattice constant [nm] | α[10$^{-6}$/K] | direct epitaxial growth |
|---|---|---|---|
| YBa$_2$Cu$_3$O$_{7-\delta}$ | a = 0.3826 b = 0.3888 c = 1.166 | 16.9 | |

Ferroelectric nonvolatile memory is fabricated by stacking a ferroelectric thin film on the conductive oxide thin film explained above. In consideration of fatigue property and easiness to epitaxially grow on the ferroelectric thin film, compounds of the group of Bi-based ferroelectric oxides called Aurivillius Family are considered excellent as the material of the ferroelectric thin film. These Bi-based layered ferroelectric oxides in the Aurivillius Family are expressed by:

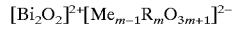

where m=2, 3, 4, 5, 6, 7 or 8
Me=Na, K, Ca, Ba, Sr, Pb or Bi
R=Fe, Ti, Nb, Ta or W Specific examples of Aurivillius Family Bi-based layered ferroelectric oxides with practical values m=2, 3, 4, 5 are shown below.

(a) $m = 2$

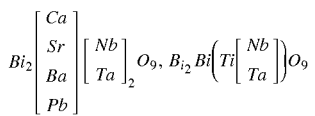

(b) $m = 3$

(c) $m = 4$

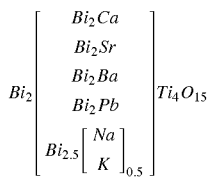

(d) $m = 5$

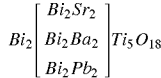

Excellent ferroelectric thin films other than Bi layered ferroelectric oxide thin films include, for example, multi-perovskite ferroelectric oxide super-lattice. They are composed of two or more oxide thin films including a ferroelectric oxide thin film and wholly operate as a ferroelectric thin film. An example of such films comprises ferroelectric oxide thin films and other different ferroelectric oxide thin films or paraelectric oxide thin films which are stacked alternately.

Assume now that the ferroelectric oxide superlattice is constituted of ferroelectric oxide thin films (thin films I) and other ferroelectric oxide thin films or paraelectric oxide thin films (thin films II) which are stacked alternately. Exemplary materials of thin films I other than the Aurivillius Family Bi-based layered ferroelectric oxides with the values m=2, 3, 4 or 5 shown above are:

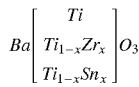

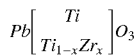

Materials of thin films II include:

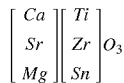

and others such as Bi—O, MgO, $CeO_2$, $MgAl_2O_4$, YSZ, and $\alpha\text{-}Al_2O_3$. When thin films II are paraelectric oxide thin films and are used as ferroelectric blocking layers, they may be selected from Bi—O, Ga—O, Al—O, B—O, Ln—O (where Ln is an element in the group of lanthanoids), Pb—O, Y—O, Sc—O, In—O, Tl—O, Hg—O, and so on.

An example of ferroelectric oxide superlattice comprising ferroelectric oxide thin films and paraelectric oxide thin films having the same perovskite crystal structure is, for example, $(BaTiO_3)_n/(SrTiO_3)_m$ superlattice, and an example comprising ferroelectric oxide thin films and paraelectric oxide thin films having different crystal structures is, for example, $(PbTiO_3)_n/(Bi_2O_3)_m$ superlattice.

Examples of ferroelectric oxide superlattice other than those shown above include those using Bi-based layered ferroelectric oxide thin films as the ferroelectric oxide thin films.

Ferroelectric oxide superlattice, in general, is analogous to strained superlattice. It is presumed that lattice mismatching between oxide thin films of the ferroelectric oxide superlattice exerts a compression force and a tensile force of decades of MPa to several GPa, for example, to opposite planes of the oxide thin films along the interface and that these forces greatly improve the ferroelectric property of the ferroelectric oxide superlattice. Also, the problem of the so-called size effects of ferroelectric materials can be removed.

The present invention has been made in consideration of the foregoing matters.

According to a first aspect of the invention, there is provided ferroelectric nonvolatile memory comprising:

a silicon substrate;

a buffer layer made of an oxide on the silicon substrate;

a conductive oxide thin film on the buffer layer;

a bismuth-based layered ferroelectric oxide thin film on the conductive oxide thin film; and a conductive layer on the bismuth-based layered ferroelectric oxide thin film.

Preferably, the buffer layer is in substantial lattice matching with the silicon substrate, the conductive oxide thin film is in substantial lattice matching with the buffer layer, and the bismuth-based layered ferroelectric oxide thin film is in substantial lattice matching with the conductive oxide thin film. Preferably, these buffer layer, conductive oxide thin film and bismuth layered ferroelectric oxide thin film are epitaxially grown on the silicon substrate.

The conductive oxide film typically has a perovskite crystal structure. The conductive oxide having the perovskite crystal structure is selected from those shown above. One of them is $SrRuO_3$ which has in bulk the unit cell of the size (a=0.55670 nm, b=0.55304 nm, c=0.78446 nm), which is 2+½ times the lattice constant (a, b) of the usual perovskite crystal structure, but, in thin film, occasionally returns to the size (a=b=0.393 nm), which is 1/(2+½) times the same size, and is easy to get into lattice matching with various underlying oxide layers.

Otherwise, the conductive oxide thin film may be one having layered perovskite crystal structure. The conductive oxide having the layered perovskite crystal structure is selected as desired from those shown above. An example is $Sr_2RuO_4$.

The buffer layer used in an embodiment of the first aspect of the invention is magnesium aluminum spinel ($MgAl_2O_4$).

When the buffer layer is magnesium aluminum spinel and the conductive oxide thin film is a conductive oxide having a perovskite crystal structure, for example, $SrRuO_3$ in the first aspect of the invention, the silicon substrate, buffer layer and conductive oxide thin film may have (110) plane orientation, and the bismuth-based layered ferroelectric oxide thin film may be (100) oriented.

The buffer layer used in another embodiment of the first aspect of the invention may be cerium oxide ($CeO_2$).

When the buffer layer is cerium oxide and the conductive oxide thin film is a conductive oxide having a perovskite crystal structure, for example, $SrRuO_3$ in the first aspect of the invention, the silicon substrate may be (100) or (111) orientated, the buffer layer may be (110) or (111) oriented, the conductive oxide thin film may be (110) oriented, and the bismuth-based layered ferroelectric oxide thin film may be (100) oriented.

The conductive layer used in the first aspect of the invention is typically a conductive oxide thin film preferably in lattice matching with the bismuth-based layered ferroelectric oxide thin film.

The conductive oxide thin film typically has a perovskite crystal structure. The conductive oxide having the perovskite crystal structure is chosen as desired from those shown above, and may be, for example, $SrRuO_3$.

The conductive oxide thin film may be one having a layered perovskite crystal structure. The conductive oxide having the layered perovskite crystal structure may be chosen as desired from those shown above, and may be, for example $Sr_2RuO_4$.

The conductive layer used in the first aspect of the invention may be a metal such as platinum (Pt), for example, in lieu of a conductive oxide thin film.

According to a second aspect of the invention, there is provided ferroelectric nonvolatile memory comprising:

a silicon substrate;

a buffer layer made of an oxide on the silicon substrate;

a conductive oxide thin film on the buffer layer;

oxide superlattice including at least a ferroelectric oxide thin film on the conductive oxide thin film; and a conductive layer on the oxide superlattice.

The oxide superlattice used in the second aspect of the invention typically comprises a first ferroelectric oxide thin film and a different second ferroelectric oxide thin film, or alternatively, a ferroelectric oxide thin film and a paraelectric oxide thin film.

The ferroelectric oxide thin film may be one having a perovskite crystal structure or a bismuth-based layered ferroelectric oxide thin film.

The oxide superlattice may be one in which artificial crystal including at least a Me—Re—O atomic layer (where Me=Ba, Pb, Sr or Ca, Re=Ti, Zr, Sn, Hf, Ce, Bi, Pb, Nb or Ta) as the intermediate atomic layer inserted between a first Bi—O atomic layer and a second Bi—O atomic layer makes one unit crystal layer in the thickness direction. If desired, one or more additional layers, such as Sr—Ta—O atomic layer and Sr—Nb—O atomic layer, may be inserted between one of the first and second Bi—O atomic layers and the Me—Re—O atomic layer.

Preferably, the buffer layer is substantially in lattice matching with the silicon substrate, the conductive oxide thin film is substantially in lattice matching with the buffer layer, and the oxide superlattice is substantially in lattice matching with the conductive oxide thin film. Preferably, these buffer layer, conductive oxide thin film and oxide superlattice are epitaxially grown on the silicon substrate.

The conductive oxide thin film typically has a perovskite crystal structure. The conductive oxide having the perovskite crystal structure is chosen as desired from those shown above, and may be, for example, $SrRuO_3$.

Otherwise, the conductive oxide thin film may be one having layered perovskite crystal structure. The conductive oxide having the layered perovskite crystal structure is selected as desired from those shown above. An example is $Sr_2RuO_4$.

The buffer layer used in an embodiment of the second aspect of the invention is magnesium aluminum spinel ($MgAl_2O_4$).

When the buffer layer is magnesium aluminum spinel and the conductive oxide thin film is a conductive oxide having a perovskite crystal structure, for example, $SrRuO_3$ in the second aspect of the invention, the silicon substrate, buffer layer and conductive oxide thin film may have (100) plane orientation. Under the condition, if the oxide superlattice comprises oxide films having a perovskite crystal structure, for example, these oxide films have (001) plane orientation. If the oxide superlattice includes a bismuth-based layered ferroelectric oxide thin film, the bismuth layered ferroelectric oxide thin film may be (001) oriented.

When the buffer layer is magnesium aluminum spinel and the conductive oxide thin film is a conductive oxide having a layered perovskite crystal structure, for example, $Sr_2RuO_4$ in the second aspect of the invention, the silicon substrate and the buffer layer have (100) plane orientation, and the conductive oxide thin film is (001) oriented. Under the condition, if the oxide superlattice comprises oxide films having a perovskite crystal structure, for example, these oxide films have (001) plane orientation. If the oxide superlattice includes a bismuth-based layered ferroelectric oxide thin film, the bismuth layered ferroelectric oxide thin film may be (001) oriented.

The buffer layer used in another embodiment of the second aspect of the invention may be cerium oxide ($CeO_2$).

When the buffer layer is cerium oxide and the conductive oxide thin film is a conductive oxide having a perovskite crystal structure, for example, $SrRuO_3$ in the second aspect of the invention, the silicon substrate may be (100) oriented, the buffer layer may be (110) oriented, and the conductive oxide thin film may be (100) oriented. Under the condition, if the oxide superlattice comprises oxide thin films having a perovskite crystal structure, these oxide thin films have (001) plane orientation. If the oxide superlattice includes a bismuth-based layered ferroelectric oxide thin film, the bismuth layered ferroelectric oxide thin film is (001) oriented.

When the buffer layer is cerium oxide and the conductive oxide thin film is a conductive oxide having a layered perovskite crystal structure, for example, $Sr_2RuO_4$ in the second aspect of the invention, the silicon substrate may be (100) oriented, the buffer layer may be (110) oriented, and the conductive oxide thin film may be (001) oriented. Under the condition, if the oxide superlattice comprises oxide thin films having a perovskite crystal structure, these oxide thin films have (001) plane orientation. If the oxide superlattice includes a bismuth-based layered ferroelectric oxide thin film, the bismuth-based layered ferroelectric oxide thin film is (001) orientated.

The conductive layer used in the second aspect of the invention is typically a conductive oxide thin film, preferably, in substantial lattice matching with the oxide superlattice.

The conductive oxide thin film typically has a perovskite crystal structure. The conductive oxide having the perovskite crystal structure is selected as desired from those shown above, and may be, for example, $SrRuO_3$.

Otherwise, the conductive oxide thin film may be one having a layered perovskite crystal structure. The conductive oxide having the layered perovskite crystal structure is selected as desired from those shown above, and may be, for example, $Sr_2RuO_4$.

In the ferroelectric nonvolatile memory according to the first aspect of the invention, by appropriate combinations of plane orientation of the silicon substrate, material and plane orientation of the buffer layer, material and plane orientation of the conductive oxide thin film, not only the buffer layer can be made in substantial lattice matching with the silicon substrate, but also the conductive oxide thin film can be made in substantial lattice matching with the buffer layer. In this case, since the adhesiveness of the conductive oxide thin film to the underlying layer is good, the conductive oxide thin film, when used as the lower electrode, does not peel away from the underlying layer. Additionally, by appropriate choice of the material for the underlying conductive oxide thin film to attain substantial lattice matching of a bismuth-based layered ferroelectric oxide thin film used as the ferroelectric thin film, the adhesiveness of the ferroelectric thin film to the conductive oxide thin film as the lower electrode is made good enough to prevent peeling. Also attained is a good fatigue property. Further, by using an appropriate conductive oxide thin film as the conductive layer used as the upper electrode, which is in substantial lattice matching with the bismuth-based layered ferroelectric oxide thin film, peeling-off of the upper electrode can be prevented.

In the ferroelectric nonvolatile memory according to the second aspect of the invention, by appropriate combinations of plane orientation of the silicon substrate, material and plane orientation of the buffer layer, material and plane orientation of the conductive oxide thin film, not only the buffer layer can be made in substantial lattice matching with the silicon substrate, but also the conductive oxide thin film can be made in substantial lattice matching with the buffer layer. In this case, since the adhesiveness of the conductive oxide thin film to the underlying layer is good, the conductive oxide thin film, when used as the lower electrode, does not peel away from the underlying layer. Additionally, since the oxide superlattice including at least a ferroelectric oxide thin film is used as the ferroelectric thin film, the oxide superlattice functions as strained superlattice so as to improve the ferroelectric property of the ferroelectric thin film and to remove the problem of the size effect. Further, by appropriate choice of the material for the underlying conductive oxide thin film to bring the oxide superlattice into substantial lattice matching, the adhesiveness of the ferroelectric thin film to the conductive oxide thin film as the lower electrode is made good enough to prevent peeling. Also attained is a good fatigue property. Further, by using an appropriate conductive oxide thin film as the conductive layer used as the upper electrode, which is in substantial lattice matching with the oxide superlattice, peeling-off of the upper electrode can be prevented.

According to a third aspect of the invention, there is provided ferroelectric nonvolatile memory comprising:
- a silicon substrate;
- a buffer layer made of an oxide on the silicon substrate;
- a bismuth-based layered ferroelectric oxide thin film on the buffer layer; and
- a first conductive oxide thin film and a second conductive oxide thin film which are made on the buffer layer at opposite sides of the bismuth-based layered ferroelectric oxide thin film so as to contact with sidewalls of the bismuth-based layered ferroelectric oxide thin film.

Preferably, the buffer layer is in substantial lattice matching with the silicon substrate, the bismuth-based layered ferroelectric oxide thin film is in substantial lattice matching with the buffer layer, and the first conductive oxide thin film and the second conductive oxide thin film are in substantial lattice matching with the conductive oxide thin film. Preferably, these buffer layer, bismuth-based layered ferroelectric oxide thin film, the first conductive oxide thin film and the second conductive oxide thin film are epitaxially grown on the silicon substrate.

The first and second conductive oxide films typically have a perovskite crystal structure. The conductive oxide having the perovskite crystal structure is selected from those shown above. One of them is $SrRuO_3$ which has in bulk the unit cell of the size (a=0.55670 nm, b=0.55304 nm, c=0.78446 nm), which is 2+½ times the lattice constant (a, b) of the usual perovskite crystal structure, but, in thin film, occasionally returns to the size (a=b=0.393 nm), which is 1/(2+½) times the same size, and is easy to get into lattice matching with various underlying oxide layers.

Otherwise, the first and second conductive oxide thin films may be one having layered perovskite crystal structure. The conductive oxide having the layered perovskite crystal structure is selected as desired from those shown above. An example is $Sr_2RuO_4$.

The buffer layer used in an embodiment of the third aspect of the invention is magnesium aluminum spinel ($MgAl_2O_4$).

When the buffer layer is magnesium aluminum spinel and the first and second conductive oxide thin films are a conductive oxide having a perovskite crystal structure, for example, $SrRuO_3$ in the third aspect of the invention, the silicon substrate, buffer layer, first and second conductive oxide thin films may be (100) oriented, and the bismuth-based layered ferroelectric oxide thin film may be (001) oriented. If the buffer layer is magnesium aluminum spinel and the first and second conductive oxide thin films are a conductive oxide having a layered perovskite crystal structure, for example, $Sr_2RuO_4$, then the silicon substrate and the buffer layer may be (100) oriented, and the bismuth-based layered ferroelectric oxide thin film, first and second conductive oxide thin films may be (001) oriented.

The buffer layer used in another embodiment of the third aspect of the invention may be cerium oxide ($CeO_2$).

When the buffer layer is cerium oxide, and the first and second conductive oxide thin films are a conductive oxide having a perovskite crystal structure, for example, $SrRuO_3$ in the third aspect of the invention, then the silicon substrate may be (100) orientation, the buffer layer may be (110) oriented, the bismuth-based layered ferroelectric oxide thin film may be (001) oriented, and the first and second conductive oxide thin films may be (100) oriented.

When the buffer layer is cerium oxide, and the first and second conductive oxide thin films are a conductive oxide having a layered perovskite crystal structure, for example, $Sr_2RuO_4$ in the third aspect of the invention, then the silicon substrate may be (100) oriented, the buffer layer may be (110) oriented, and the bismuth-based layered ferroelectric oxide thin film, first and second conductive oxide thin films may be (001) oriented.

In a preferred embodiment of the third aspect of the invention, an insulating cap layer is provided to lie over the bismuth-based layered ferroelectric oxide thin film, first conductive oxide thin film and second conductive oxide thin film. The insulating cap layer is used as a protective film. The insulating cap layer may be made of any insulating material provided its thermal expansion coefficient is not largely different from that of those of the underlying bismuth-based layered ferroelectric oxide thin film, first and second conductive oxide thin films. Specific examples of materials for the insulating cap layer include $Al_2O_3$, $CeO_2$ and YSZ, for example.

According to a fourth aspect of the invention, there is provided ferroelectric nonvolatile memory comprising:
- a silicon substrate;
- a buffer layer made of an oxide on the silicon substrate;
- an oxide superlattice including at least a ferroelectric oxide thin film on the buffer layer; and
- a first conductive oxide thin film and a second conductive oxide thin film which are made on the buffer layer at opposite sides of the oxide superlattice so as to contact with sidewalls of the oxide superlattice.

The oxide superlattice used in the fourth aspect of the invention preferably comprises a ferroelectric oxide thin film and a paraelectric ferroelectric oxide thin film. In this case, the paraelectric oxide thin film is chosen as desired from those shown above, and may be, for example, Bi—O layer.

The ferroelectric oxide thin film may be one having a perovskite crystal structure or a bismuth-based layered ferroelectric oxide thin film.

The oxide superlattice may be one in which artificial crystal including at least a Me—Re—O atomic layer (where Me=Ba, Pb, Sr or Ca, Re=Ti, Zr, Sn, Hf, Ce, Bi, Pb, Nb or Ta) as the intermediate atomic layer inserted between a first Bi—O atomic layer and a second Bi—O atomic layer makes one unit crystal layer in the thickness direction. If desired, one or more additional layers, such as Sr—Ta—O atomic layer and Sr—Nb—O atomic layer, may be inserted between one of the first and second Bi—O atomic layers and the Me—Re—O atomic layer.

Preferably, the buffer layer is in substantial lattice matching with the silicon substrate, the oxide superlattice is in substantial lattice matching with the buffer layer, and the first and second conductive oxide thin films are in substantial lattice matching with the buffer layer. Preferably, these buffer layer, oxide superlattice, first and second conductive oxide thin films are epitaxially grown on the silicon substrate.

The first and second conductive oxide thin films typically have a perovskite crystal structure. The conductive oxide having the perovskite crystal structure is selected as desired from those shown above. An example is $SrRuO_3$.

Otherwise, the first and second conductive oxide thin films may be one having layered perovskite crystal structure. The conductive oxide having the layered perovskite crystal structure is selected as desired from those shown above. An example is $Sr_2RuO_4$.

The buffer layer used in an embodiment of the fourth aspect of the invention is magnesium aluminum spinel ($MgAl_2O_4$).

When the buffer layer is magnesium aluminum spinel and the first and second conductive oxide thin films are a conductive oxide having a perovskite crystal structure, for example, $SrRuO_3$ in the fourth aspect of the invention, then the silicon substrate, buffer layer, first and second conductive oxide thin films may have (100) plane orientation. Under the condition, if the ferroelectric oxide thin film constituting the oxide superlattice has a perovskite crystal structure, the ferroelectric oxide thin film has (001) plane orientation. If the ferroelectric oxide thin film constituting the oxide superlattice is a bismuth-based layered ferroelectric oxide thin film, the bismuth-based layered ferroelectric oxide thin film may be (001) oriented.

When the buffer layer is magnesium aluminum spinel and the first and second conductive oxide thin films are a conductive oxide having a layered perovskite crystal structure, for example, $Sr_2RuO_4$ in the fourth aspect of the invention, then the silicon substrate and the buffer layer may be (100) oriented, the first and second conductive oxide thin films may be (001) oriented. Under the condition, if the ferroelectric oxide thin film constituting the oxide superlattice has a perovskite crystal structure, the ferroelectric oxide thin film has (001) plane orientation. If the ferroelectric oxide thin film constituting the oxide superlattice is a bismuth-based layered ferroelectric oxide thin film, the bismuth-based layered ferroelectric oxide thin film has (001) orientation.

The buffer layer used in another embodiment of the fourth aspect of the invention may be cerium oxide ($CeO_2$).

When the buffer layer is cerium oxide and the first and second conductive oxide thin films are a conductive oxide having a perovskite crystal structure, for example, $SrRuO_3$ in the fourth aspect of the invention, then the silicon substrate may be (100) oriented, the buffer layer may be (110) oriented, and the first and second conductive oxide thin films may be (100) oriented. Under the condition, if the ferroelectric oxide thin film constituting the oxide superlattice has a perovskite crystal structure, then the ferroelectric oxide thin film is (001) oriented. If the ferroelectric oxide thin film constituting the oxide superlattice is a bismuth-based layered ferroelectric oxide thin film, it is (100) oriented.

When the buffer layer is cerium oxide and the first and second conductive oxide thin films are a conductive oxide having a layered perovskite crystal structure, for example, $Sr_2RuO_4$ in the fourth aspect of the invention, then the silicon substrate may be (100) oriented, the buffer layer may be (110) oriented, and the first and second conductive oxide thin films may be (001) oriented. Under the condition, if the ferroelectric oxide thin film constituting the oxide superlattice has a perovskite crystal structure, then the ferroelectric oxide thin film is (001) oriented. If the ferroelectric oxide thin film constituting the oxide superlattice is a bismuth-based layered ferroelectric oxide thin film, it is (001) oriented.

In a preferred embodiment of the fourth aspect of the invention, an insulating cap layer is further provided to lie over the oxide superlattice, first conductive oxide thin film and second conductive oxide thin film. The insulating cap layer is used as a protective film. The material of the insulating cap layer may be an insulating material, such as $Al_2O_3$, $CeO_2$ and YSZ, which is not largely different in thermal expansion coefficient from the underlying oxide superlattice, first conductive oxide thin film and second conductive oxide thin film, like in the third aspect of the invention.

In the ferroelectric nonvolatile memory according to the third aspect of the invention, by appropriate combinations of plane orientation of the silicon substrate, material and plane orientation of the buffer layer, plane orientation of the bismuth-based layered ferroelectric oxide thin film, and material and plane orientation of the first and second conductive oxide thin films, the buffer layer can be made in substantial lattice matching with the silicon substrate, the bismuth-based layered ferroelectric oxide thin film can be made in substantial lattice matching with the buffer layer, and the first and second conductive oxide thin films can be made in substantial lattice matching with the buffer layer. In this case, the first and second conductive oxide thin films, which are used as electrodes for applying electric fields, have a good adhesiveness to the buffer layer and to the bismuth-based layered ferroelectric oxide thin film, and are free from the peel-off problem. Also obtained a good fatigue property. In addition, when the bismuth-based layered ferroelectric oxide thin film is oriented such that its axis of easy polarization extends in parallel with the major plane of the substrate, the ferroelectric property of the bismuth-based layered ferroelectric oxide thin film can be effectively used by applying an electric field along the axis of easy polarization.

In the ferroelectric nonvolatile memory according to the fourth aspect of the invention, by appropriate combinations of plane orientation of the silicon substrate, material and plane orientation of the buffer layer, plane orientation of the oxide superlattice, material and plane orientation of the first and second conductive oxide thin films, the buffer layer can be made in substantial lattice matching with the silicon substrate, the oxide superlattice can be made in substantial lattice matching with the buffer layer, and the first and second conductive oxide thin films can be made in substantial lattice matching with the buffer layer. In this case, the first and second conductive oxide thin films, which are used as electrodes for applying electric fields, have a good adhesiveness to the buffer layer and to the oxide superlattice, and are free from the peel-off problem. Also obtained a good fatigue property. In addition, when the ferroelectric oxide thin film contained in the oxide superlattice is oriented such that its axis of easy polarization extends in parallel with the major plane of the substrate, the ferroelectric property can be effectively used by applying an electric field along the axis of easy polarization. When, in particular, the oxide superlattice comprises a ferroelectric oxide thin film and a paraelectric oxide thin film, the paraelectric oxide thin film behaves as a ferroelectric blocking layer to increase its intra-plane anisotropy, and the ferroelectric property of the oxide superlattice can be used more effectively. Moreover, when the oxide superlattice has a structure in which artificial crystal including at least a Me—Re—O atomic layer (where Me=Ba, Pb, Sr or Ca, Re=Ti, Zr, Sn, Hf, Ce, Bi, Pb, Nb or Ta) as the intermediate atomic layer inserted between a first Bi—O atomic layer and a second Bi—O atomic layer makes one unit crystal layer in the thickness direction and in which, if desired, one or more additional layers, such as Sr—Ta—O atomic layer and Sr—Nb—O atomic layer, are inserted between one of the first and second Bi-O atomic layers and the Me—Re—O atomic layer, the intra-plane anisotropy becomes higher, and the ferroelectric property of the oxide superlattice can be used more effectively. Additionally, since the oxide superlattice behaves as strained superlattice, the ferroelectric property of the ferroelectric thin film is improved, and the problem of the size effect is removed.

According to a fifth aspect of the invention, there is provided an oxide multi-layered structure comprising:

a silicon substrate;

a buffer layer made of an oxide on the silicon substrate; and a conductive oxide thin film on the buffer layer.

Preferably, the buffer layer is in substantial lattice matching with the silicon substrate, and the conductive oxide thin film is in substantial lattice matching with the buffer layer. Preferably, the buffer layer and the conductive oxide thin film are epitaxially grown on the silicon substrate.

In the oxide multi-layered structure according to the fifth aspect of the invention, by appropriate combinations of plane orientation of the silicon substrate, material and plane orientation of the buffer layer, material and plane orientation of the conductive oxide thin film, not only the buffer layer can be made in substantial lattice matching with the silicon substrate, but also the conductive oxide thin film can be made in substantial lattice matching with the buffer layer. In this case, since the conductive oxide thin film has a good adhesiveness to the underlying layer, the conductive oxide thin film can be used as an electrode which does not peel away from the underlying layer. Moreover, by selecting an appropriate material of the conductive oxide thin film in accordance with the selected material of the ferroelectric thin film to attain substantial lattice matching of the ferroelectric thin film with the underlying conductive oxide thin film, the adhesiveness of the ferroelectric thin film to the conductive oxide thin film becomes better to remove the peel-off problem. Also obtained a good fatigue property.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Embodiments of the invention are described below with reference to the drawings.

Figure 1:
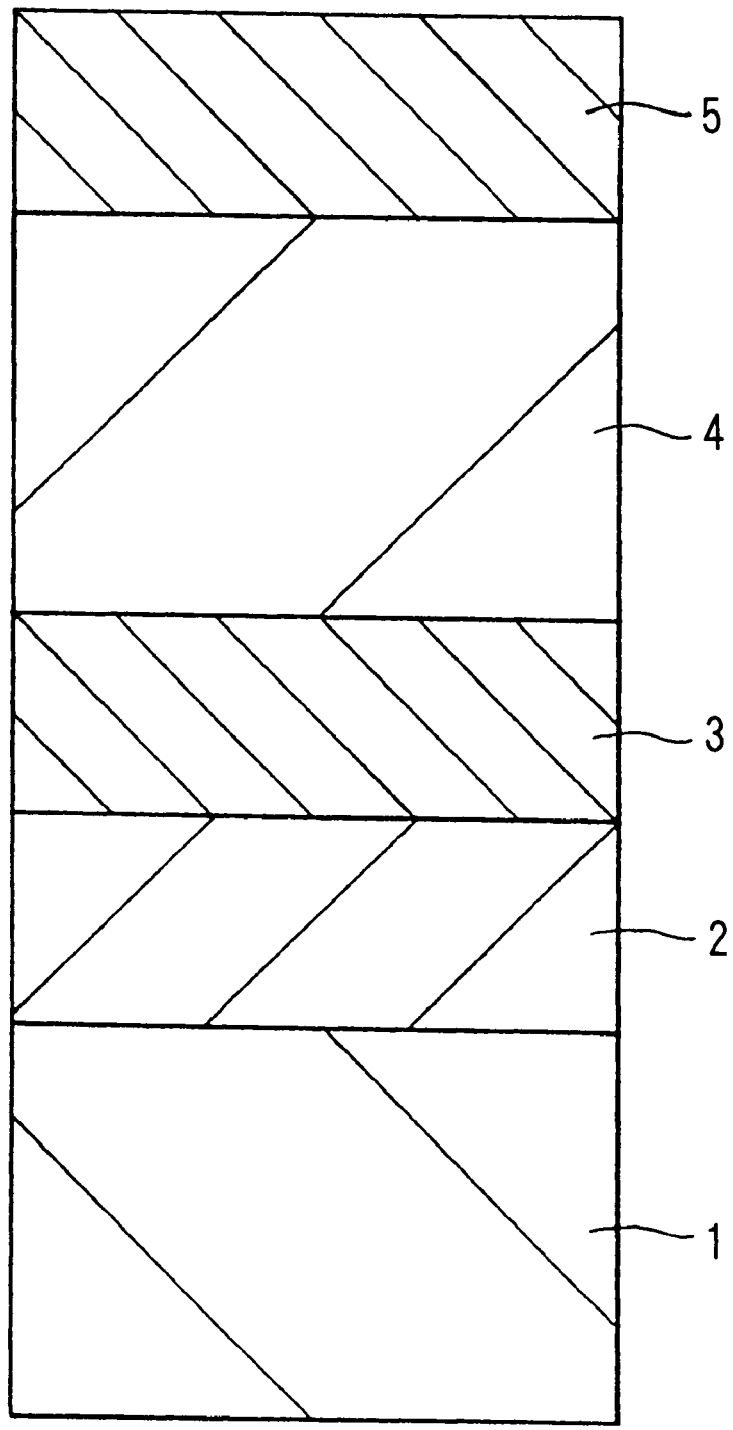
FIG. 1 is a cross-sectional view of ferroelectric nonvolatile memory according to a first embodiment of the invention.

FIG. 1 is a cross-sectional view showing ferroelectric nonvolatile memory according taken as a first embodiment of the invention.

As shown in FIG. 1, the ferroelectric nonvolatile memory comprises a $MgAl_2O_4$ thin film 2, $SrRuO_3$ thin film 3, $Bi_2SrTa_2O_9$ thin film 4 and $SrRuO_3$ thin film 5 which are sequentially stacked on a Si substrate 1. The $MgAl_2O_4$ thin film 2 is the buffer layer. The $SrRuO_3$ thin film 3 and the $SrRuO_3$ thin film 5 are lower and upper electrodes. The specific resistant value of the $SrRuO_3$ thin film 3 and the $SrRuO_3$ thin film 5 is in the range from 200 $\mu\Omega\cdot$cm to 300 $\mu\Omega\cdot$cm which is low enough for use as electrodes. The $Bi_2SrTa_2O_9$ thin film 4 constitutes the ferroelectric thin film.

In this case, all of the Si substrate 1, $MgAl_2O_4$ thin film 2, $SrRuO_3$ thin film 3 and $SrRuO_3$ thin film 5 have (110) plane orientation. The $Bi_2SrTa_2O_9$ thin film 4 has (100) plane orientation. The Si substrate 1 may be either doped or non-doped with an impurity.

Figure 2:
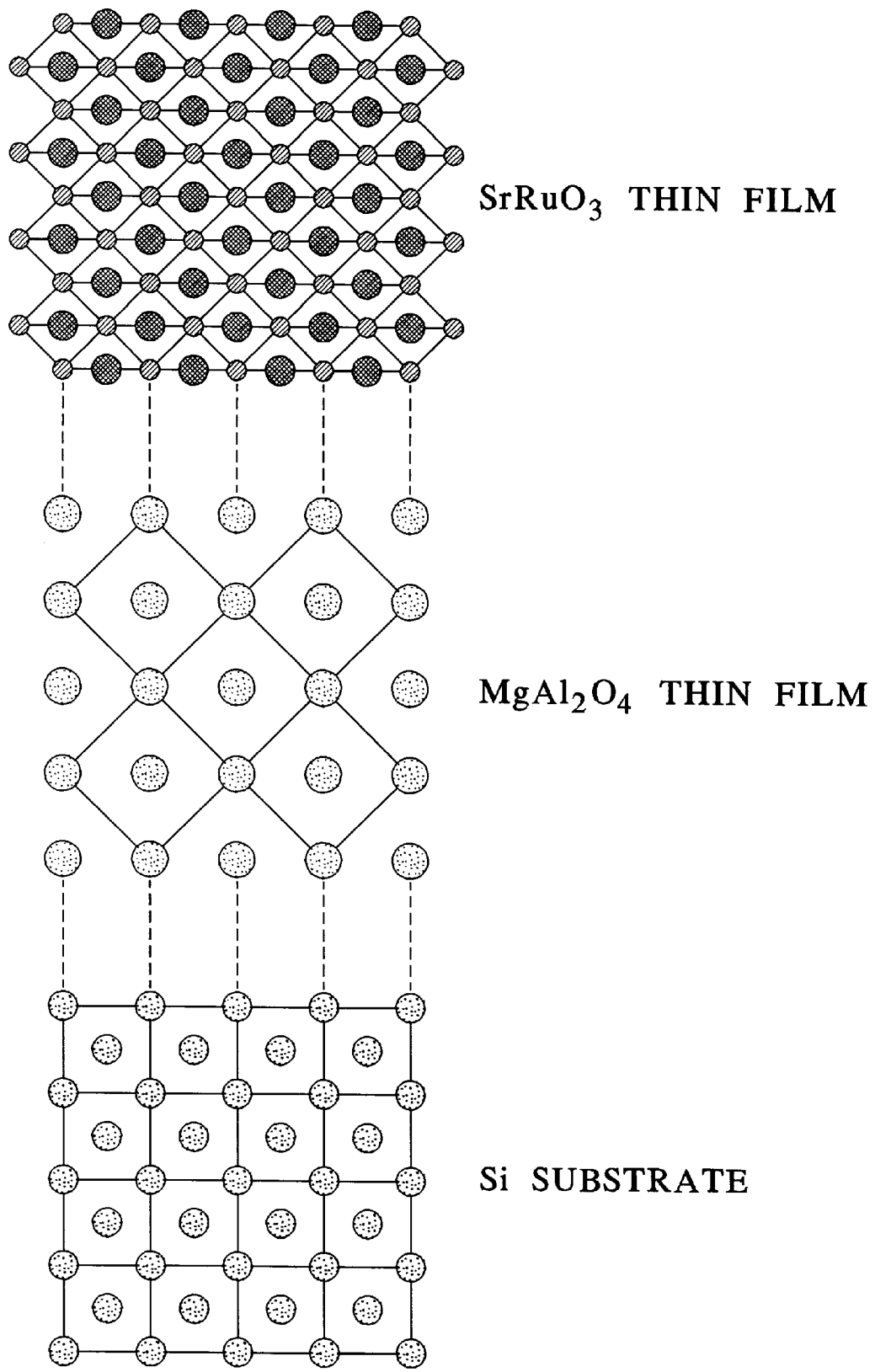
FIG. 2 is a diagram schematically showing lattice matching among a Si substrate, $MgAl_2O_4$ thin film and a $SrRuO_3$ thin film in the ferroelectric nonvolatile memory according to the first embodiment of the invention.

In the ferroelectric nonvolatile memory, the Si substrate 1, $MgAl_2O_4$ thin film 2, $SrRuO_3$ thin film 3, $Bi_2SrTa_2O_9$ thin film 4 and $SrRuO_3$ thin film 5 are in substantially complete lattice matching with each other. For example, as apparent from FIG. 2 which schematically shows an aspect of lattice matching among the Si substrate 1, $MgAl_2O_4$ thin film 2 and $SrRuO_3$ thin film 3, the Si substrate 1 is in substantially complete lattice matching with the $MgAl_2O_4$ thin film 2, and the $MgAl_2O_4$ thin film 2 with the $SrRuO_3$ thin film 3.

Figure 3:
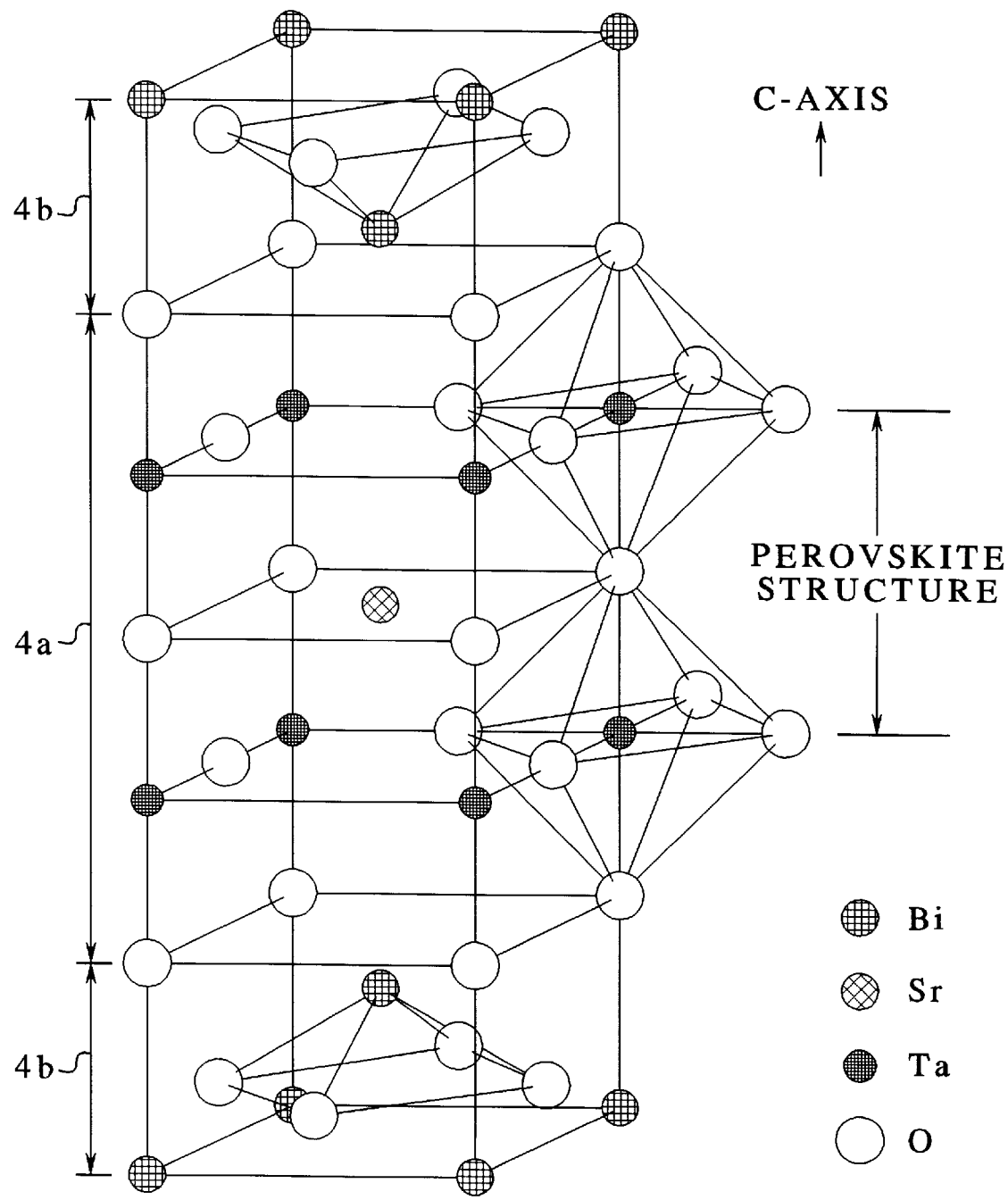
FIG. 3 is a schematic diagram showing the crystal structure of $Bi_2SrTa_2O_9$ used as the material of a ferroelectric thin film in the ferroelectric nonvolatile memory according to the first embodiment of the invention.

FIG. 3 shows a half the c-axis length of the crystal structure of the $Bi_2SrTa_2O_9$ thin film 4 used as the layered ferroelectric oxide thin film. As shown in FIG. 3, the $Bi_2SrTa_2O_9$ thin film 4 has a structure in which a $SrTaO_3$ layer 4a having a perovskite crystal structure is inserted between upper and lower Bi—O layers 4b. It can be presumed with the $Bi_2SrTa_2O_9$ thin film 4 that the Bi—O layer 4b behaving as a blocking layer blocks the ferroelectric polarization wave in the c-axis direction produced by the Ta—O octahedron in the $SrTaO_3$ layer 4a and that it actually results in anisotropy in physical property such as ferroelectric property.

In ferroelectric nonvolatile memory, effective ferroelectric hysteresis is of course desired. To this end, two requirements, namely, a high aspect ratio (=residual polarization (Pr)/spontaneous polarization ($P_s$) and an adequately low coercive field ($E_c$) must be satisfied. In order to improve this ratio, it is important to efficiently utilize the anisotropy of crystal axis, i.e. anisotropy of polarization, of the $Bi_2SrTa_2O_9$ thin film 4.

Figure 4:
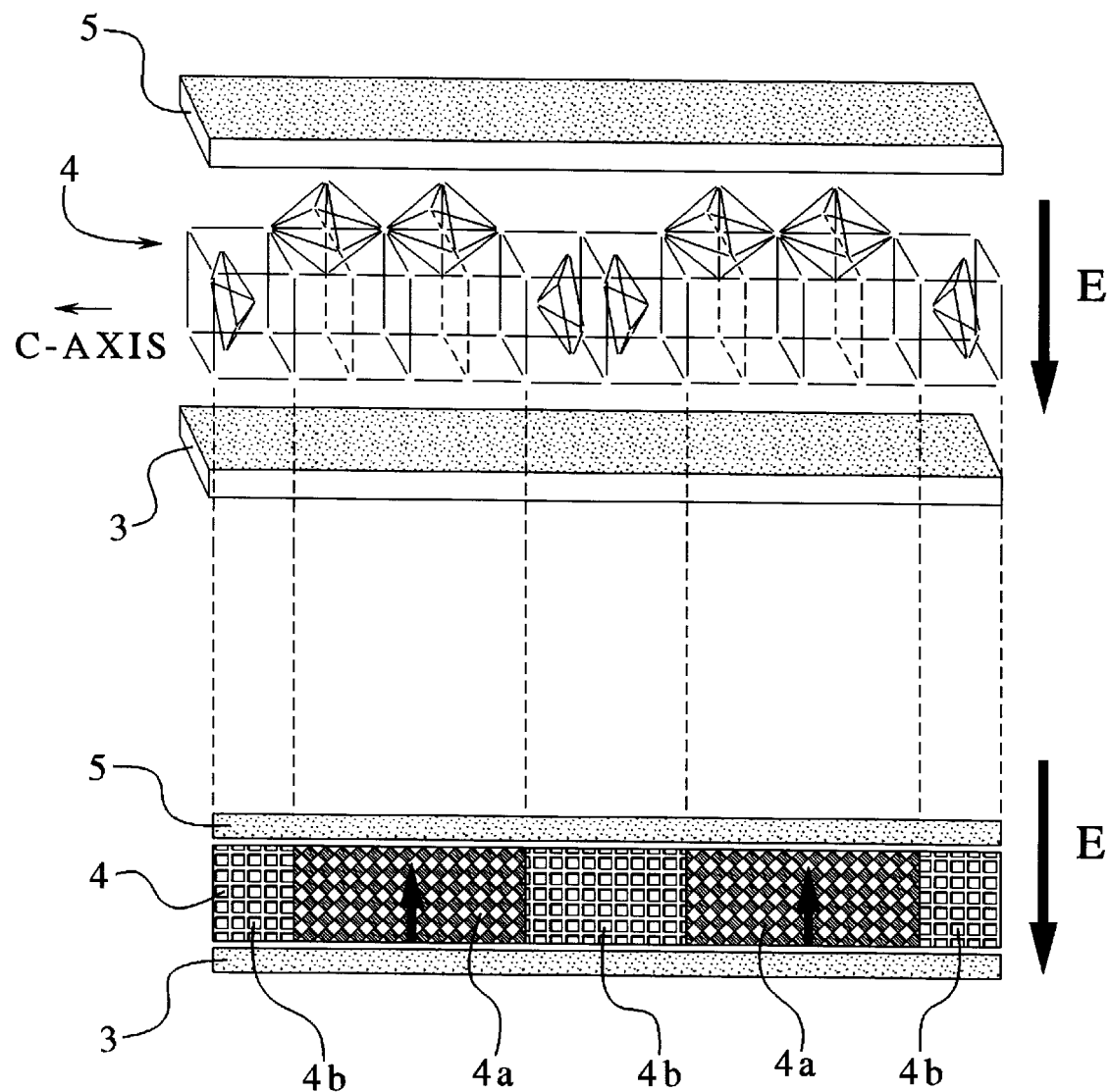
FIG. 4 is a schematic diagram for explaining the orientation of a $Bi_2SrTa_2O_9$ thin film used as the ferroelectric thin film in the ferroelectric nonvolatile memory according to the first embodiment of the invention.

In the first embodiment, orientation of the $Bi_2SrTa_2O_9$ thin film 4 is determined to make the a-axis or b-axis be parallel to the direction of the electric field while making the c-axis lie in the plane in parallel with the plane because the $Bi_2SrTa_2O_9$ thin film 4 has the inner layer structure with c-axis orientation like "blocking layer/perovskite layer/ blocking layer". The orientation of the $Bi_2SrTa_2O_9$ thin film 4 is shown by the crystalline structure of FIG. 4. In FIG. 4, it is ideal that the subunit ($SrTaO_3$ layer 4a) generating the ferroelectric polarization in the direction of the electric field (E) appears with an appropriate ratio of thickness relative to the blocking layer (Bi—O layer 4b) in the scale of atomic layers, also from the perspective of the depolarization factor.

In order to fabricate the ferroelectric nonvolatile memory having the above-explained arrangement according to the first embodiment, the $MgAl_2O_4$ thin film 2, $SrRuO_3$ thin film 3, $Bi_2SrTa_2O_9$ thin film 4 and $SrRuO_3$ thin film 5 are epitaxially grown in sequence on the Si substrate 1. Reactive evaporation, sputtering, laser abrasion, or other like methods can be used for the epitaxial growth. Among them, reactive evaporation is one of evaporation methods for effecting evaporation in a high-oxidizing atmosphere of ozone or active oxygen gas created near the substrate by commonly using resistance heating and electron beam heating, and also called active reactive evaporation (for example, (17) Seramikkusu Ronbunshi, 98, 749–753 (1990)). During fabrication of films by reactive evaporation, control of the film thickness in the level of atoms in each unit cell is possible by monitoring RHEED (reflection high energy electron diffraction) vibrations.

Discussed below are problems of the leakage current (or dielectric breakdown) and the size effect which occur with a decrease in thickness of the ferroelectric thin film in ferroelectric nonvolatile memory.

Figure 5:
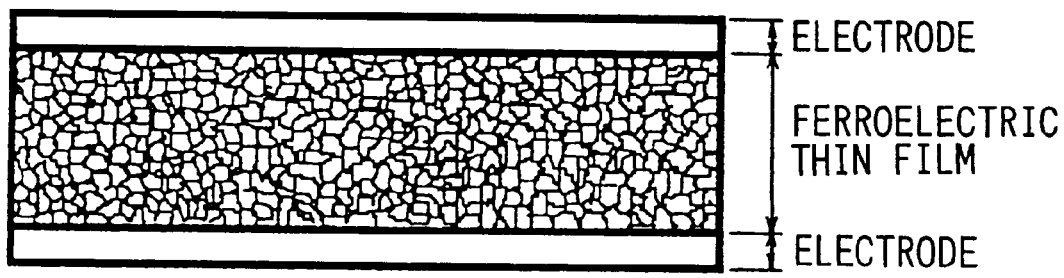
FIG. 5 is a cross-sectional view for explaining the problem of leakage current accompanied by a decrease in thickness of a ferroelectric thin film in ferroelectric nonvolatile memory.
Figure 6:
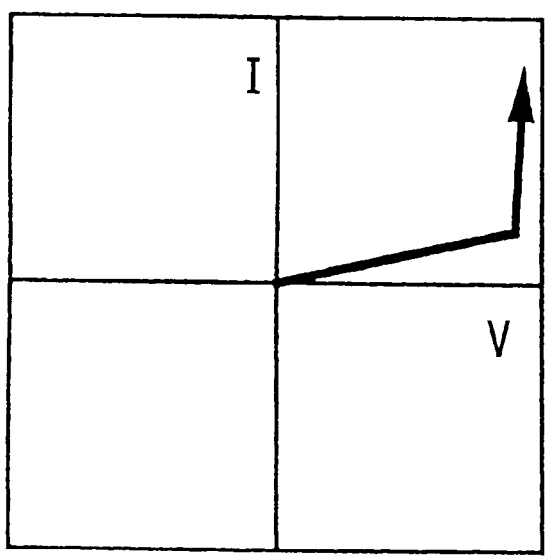
FIG. 6 is a graph showing current-voltage characteristics of the ferroelectric nonvolatile memory shown in FIG. 5.

A ferroelectric thin film inserted between electrodes is desired to include more than ten crystal grains in the thickness direction in order to prevent leakage current because the leakage current greatly increases with a decrease in the crystal grains between the electrodes. FIG. 5 schematically shows an aspect of a ferroelectric thin film (about 1 $\mu$m thick) in problem. FIG. 6 shows current-voltage (I–V) characteristics of ferroelectric nonvolatile memory using the thin film.

Figure 7:
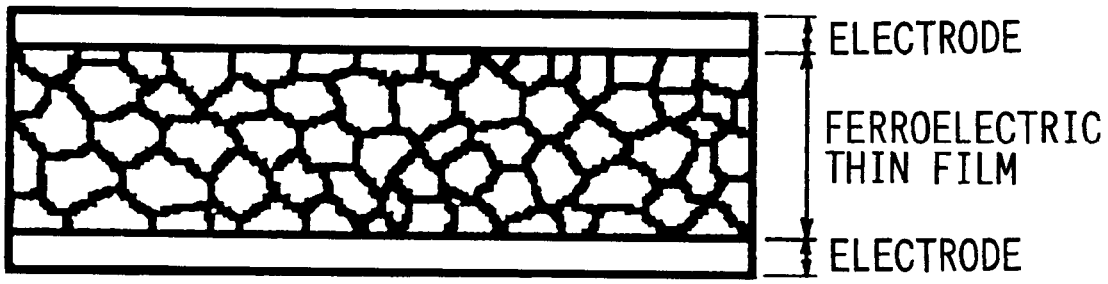
FIG. 7 is a cross-sectional view for explaining the problem of leakage current, accompanied by a decrease in thickness of a ferroelectric thin film in ferroelectric nonvolatile memory.
Figure 8:
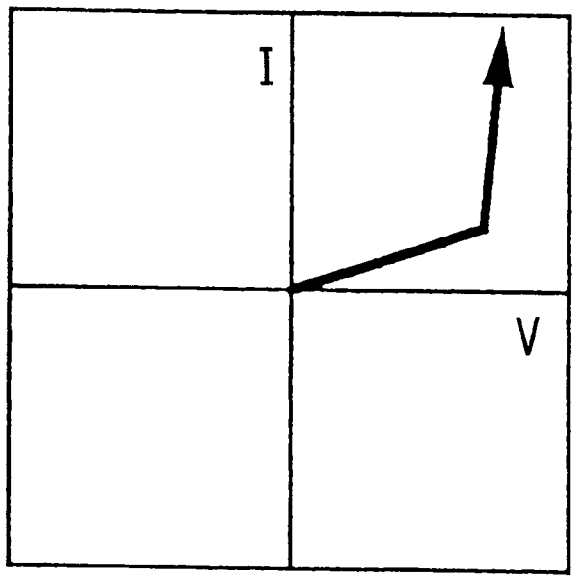
FIG. 8 is a graph showing current-voltage characteristics of the ferroelectric nonvolatile memory shown in FIG. 7.

FIG. 7 schematically shows an aspect of the ferroelectric thin film with a reduced thickness around 100 nm in which the ferroelectric thin film includes less than ten crystal grains in the thickness direction. FIG. 8 shows I–V characteristics of ferroelectric nonvolatile memory using the thin film. As apparent from comparison of FIG. 8 with FIG. 6, the leakage current in case of a film having less than ten crystal grains between the electrodes is greater than leakage current in case of a film having more than ten crystal grains between the electrodes.

Figure 9:
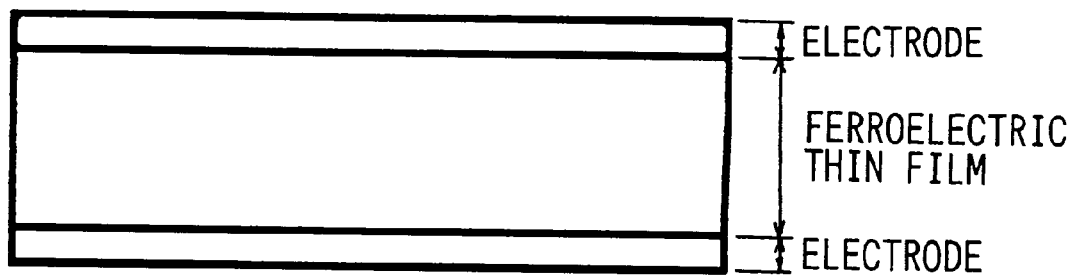
FIG. 9 is a cross-sectional view for explaining the problem of leakage current accompanied by a decrease in thickness of a ferroelectric thin film in ferroelectric nonvolatile memory.
Figure 10:
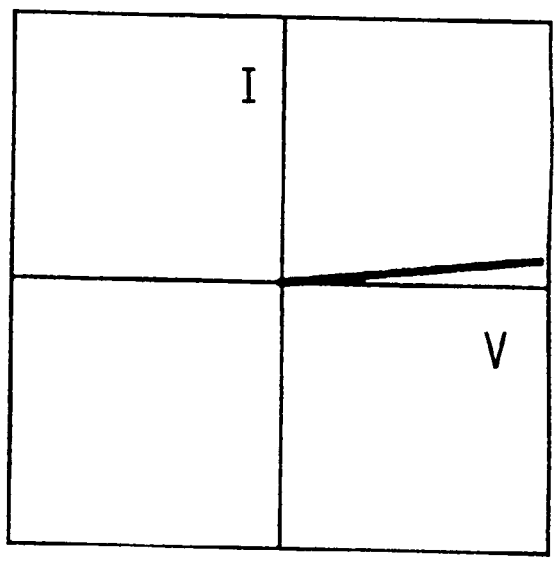
FIG. 10 is a graph showing current-voltage characteristics of the ferroelectric nonvolatile memory shown in FIG. 9.

When the thickness is further reduced below 50 nm, the intrinsic function of the device as ferroelectric nonvolatile memory may disappear. On the other hand, FIG. 9 schematically shows an aspect of a ferroelectric thin film which is a single crystal ferroelectric thin film having a thickness less than 50 nm. FIG. 10 shows I–V characteristics of ferroelectric nonvolatile memory having the thin film. As apparent from comparison of FIG. 10 with FIG. 6 and FIG. 8, the leakage current in case of the single crystal ferroelectric thin film having no grain boundary in the crystal is much smaller than the leakage current in case of the polycrystalline ferroelectric thin film.

Next explained the size effect of ferroelectric materials. The size effect represents whether a ferroelectric thin film can or cannot hold its ferroelectric property when the thickness of the ferroelectric thin film is reduced. This is the phenomenon in which, when the grain size of a material stable as tetragonal crystal (ferroelectric) at room temperature decreases, it suddenly turns to cubic crystal below a critical value and loses its ferroelectric property. This has been discussed in relation to fine particles. In other words, this is a property change accompanied by three-dimensional size shrinkage. Specifically, the size effect is less than 0.1 $\mu$m in case of $BaTiO_3$, for example. Also with a PZT thin film, the same result was confirmed.

Taking the leakage current and the size effect into consideration, using the single crystalline $Bi_2SrTa_2O_9$ thin film 4 as the ferroelectric thin film in the first embodiment would be advantageous when the thickness of the ferroelectric thin film decreases around 100 nm to 200 nm.

The ferroelectric nonvolatile memory according to the first embodiment promises the following various advantages. That is, the $SrRuO_3$ thin film 3 used as the lower electrode is in good lattice matching with both the underlying $MgAl_2O_4$ thin film 2 and the upperlying $Bi_2SrTa_2O_9$ thin film 4, and the peel-off problem of the lower electrode is overcome. Similarly, the $SrRuO_3$ thin film 5 used as the upper electrode is in good lattice matching with the $Bi_2SrTa_2O_9$ thin film 4, and the peel-off problem of the upper electrode is overcome. Also the fatigue property is good. Since the single crystal $Bi_2SrTa_2O_9$ thin film 4 is used, the leakage current is very small, and degradation of the ferroelectric property of the $Bi_2SrTa_2O_9$ thin film 4 accompanied by the three-dimensional size effect can be prevented, even with a decrease in distance between the electrodes, that is, a decrease in thickness of the $Bi_2SrTa_2O_9$ thin film 4. Then, values near the best polarization values of ferroelectric materials can be utilized.

As described, the first embodiment can realize all-oxides-type ferroelectric nonvolatile memory with excellent characteristics and high reliability by optimizing the structure.

Figure 11:
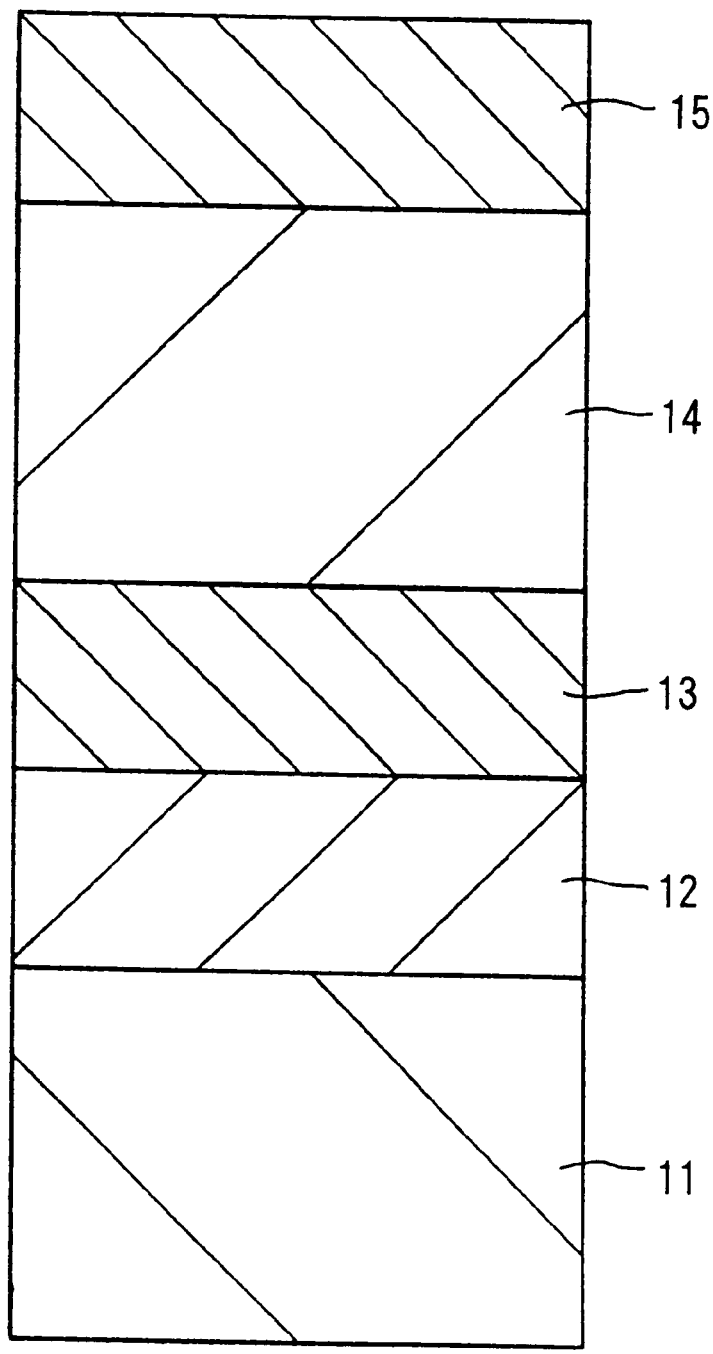
FIG. 11 is a cross-sectional view showing ferroelectric nonvolatile memory according to a second embodiment of the invention.

FIG. 11 is a cross-sectional view of ferroelectric nonvolatile memory taken as a second embodiment of the invention.

As shown in FIG. 11, the ferroelectric nonvolatile memory comprises a $MgAl_2O_4$ thin film 12, $Sr_2RuO_4$ thin film 13, $(BaTiO_3)_n/(SrTiO_3)_m$ superlattice 14 and $Sr_2RuO_4$ thin film 15 which are sequentially stacked on a Si substrate 11. The $MgAl_2O_4$ thin film 12 is the buffer layer. The $Sr_2RuO_4$ thin film 13 and the $Sr_2RuO_4$ thin film 15 are lower and upper electrodes. The specific resistant value of the $Sr_2RuO_4$ thin film 13 and the $Sr_2RuO_4$ thin film 15 is in the range from 200 $\mu\Omega$·cm to 300 $\mu\Omega$·cm which is low enough for use as electrodes. The $(BaTiO_3)_n/(SrTiO_3)_m$ superlattice 14 constitutes the ferroelectric thin film.

In this case, all of the Si substrate 11, $MgAl_2O_4$ thin film 12, $Sr_2RuO_4$ thin film 13 and $Sr_2RuO_4$ thin film 15 have (110) plane orientation. The $(BaTiO_3)_n/(SrTiO_3)_m$ superlattice 14 has (001) plane orientation. The Si substrate 11 may be either doped or non-doped with an impurity.

Figure 12:
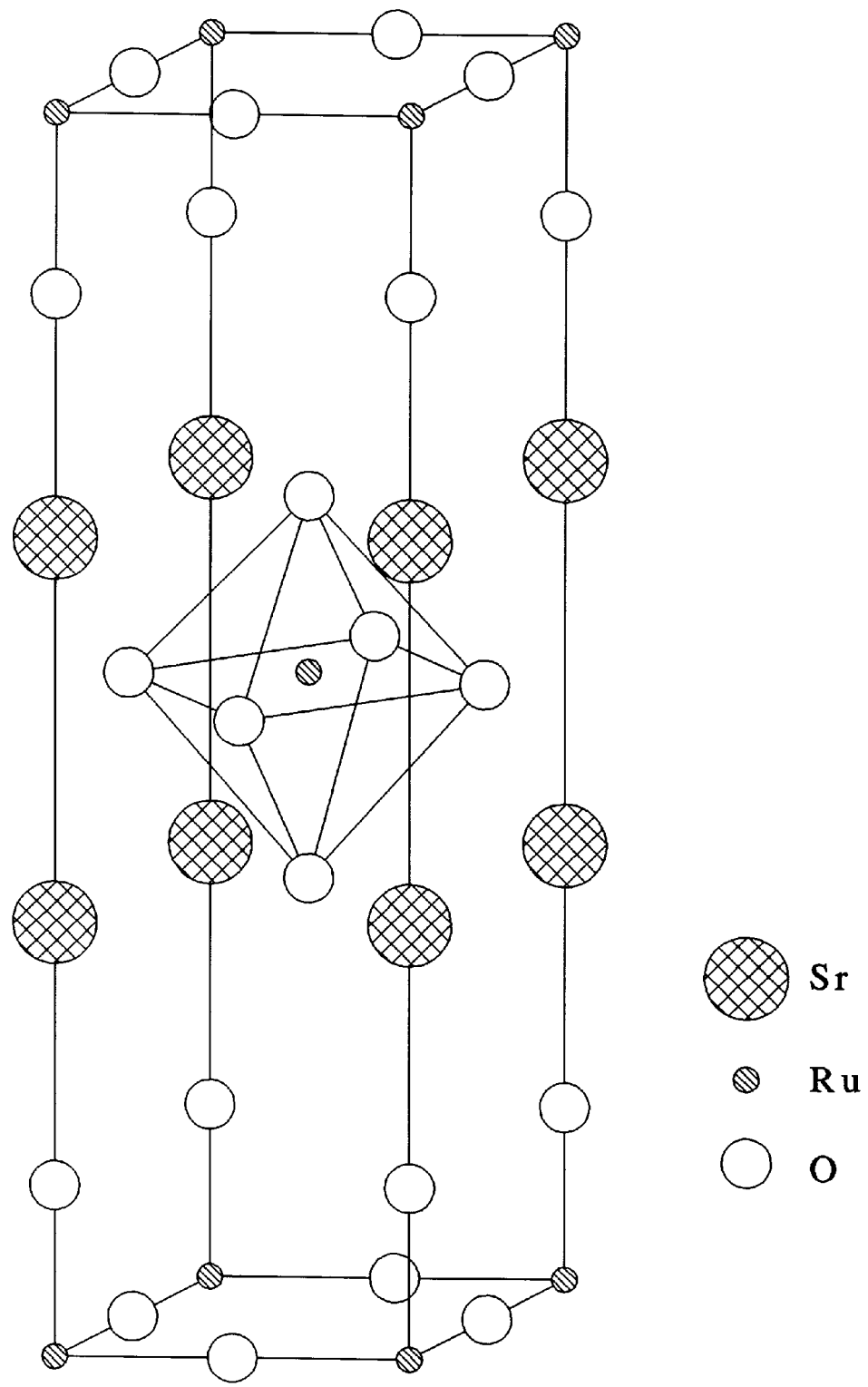
FIG. 12 is a schematic diagram showing the crystal structure of Sr2RuO4 used as an electrode material in ferroelectric nonvolatile memory according to the invention.

In the ferroelectric nonvolatile memory, the Si substrate 11, $MgAl_2O_4$ thin film 12, $Sr_2RuO_4$ thin film 13, $(BaTiO_3)_n/(SrTiO_3)_m$ superlattice 14 and $Sr_2RuO_4$ thin film 15 are in substantially complete lattice matching with each other. The crystal structure of $Sr_2RuO_4$ is shown in FIG. 12 for reference.

The $(BaTiO_3)_n/(SrTiO_3)_m$ superlattice 14 is made by alternately stacking ferroelectric oxide thin films of $BaTaO_3$ having a perovskite crystal structure and paraelectric oxide thin films of $SrTiO_3$ having a perovskite crystal structure.

The ferroelectric nonvolatile memory according to the second embodiment can be fabricated by the same method as used for the ferroelectric nonvolatile memory according to the first embodiment.

In addition to the same advantages as those of the first embodiment, the second embodiment has the additional advantage that it can more effectively suppress the size effect of the ferroelectric material and can hence improve the ferroelectric property of the ferroelectric thin film by using as the ferroelectric thin film the $(BaTiO_3)_n/(SrTiO_3)_m$ superlattice 14 substantially equivalent to strained superlattice.

There is one type of ferroelectric nonvolatile memory as shown in the first and second embodiments in which the conductive layer is stacked on the ferroelectric thin film to use the conductive layer and the conductive oxide thin film under the ferroelectric thin film as upper and lower electrodes such that an electric field vertical (longitudinal) to the plane of the substrate is produced when a voltage is applied between the upper electrode and the lower electrode. In another type of ferroelectric nonvolatile memory, electrodes can be located at opposite sides of a patterned ferroelectric thin film such that an electric field parallel (transversal) to the plane of the substrate is produced by applying a voltage between the electrodes. When the axis of easy polarization of the ferroelectric thin film is parallel to the plane of the substrate, the latter ferroelectric nonvolatile memory of the transversal field type or planar type is effective in obtaining a high ferroelectric property. Also for integration, the planar type ferroelectric nonvolatile memory is more advantageous.

Taken as third and fourth embodiments are some versions of planar type ferroelectric nonvolatile memory.

Figure 13:
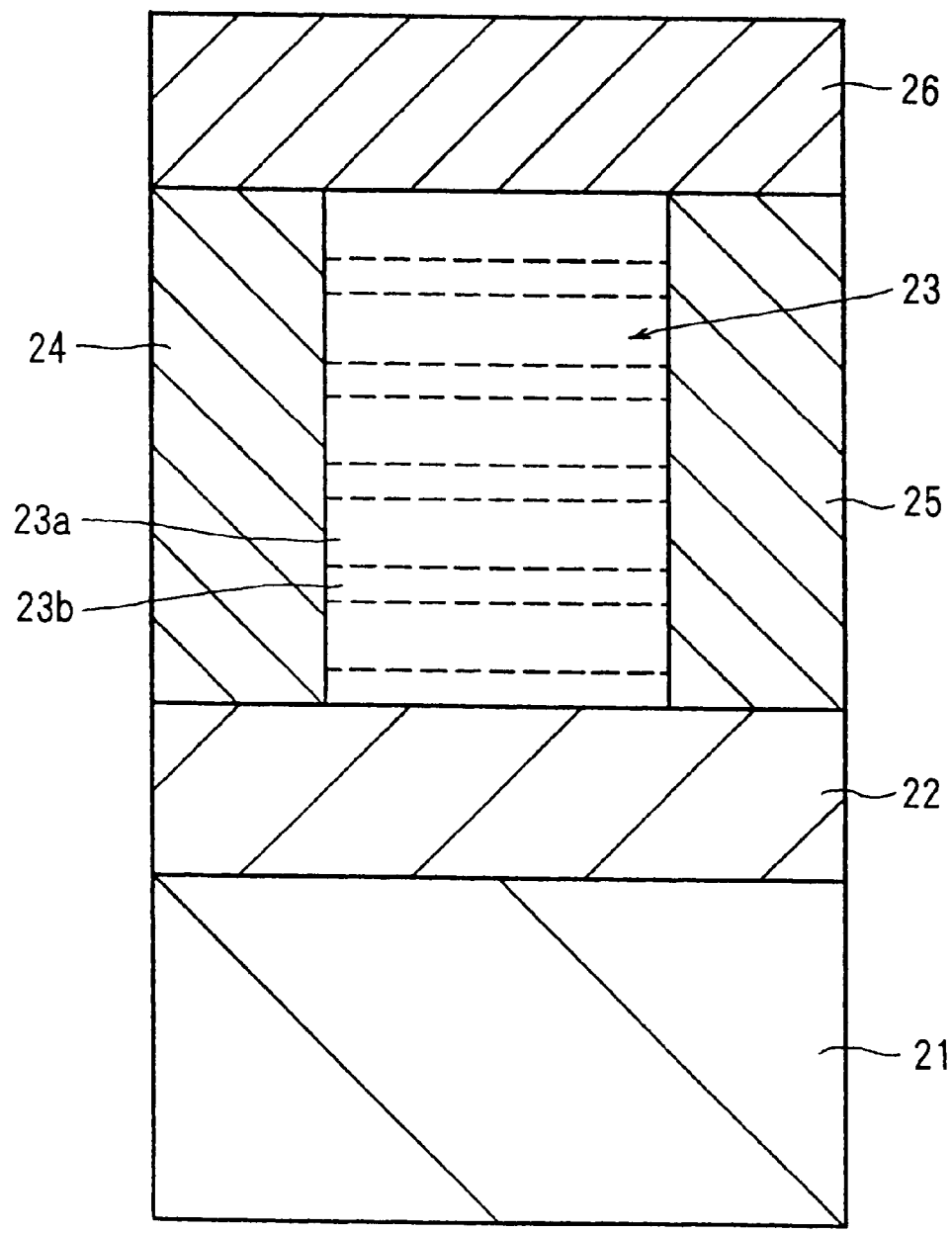
FIG. 13 is a cross-sectional view showing ferroelectric nonvolatile memory according to a third embodiment of the invention.

FIG. 13 is a cross-sectional view of ferroelectric nonvolatile memory according to the third embodiment.

As shown in FIG. 13, the ferroelectric nonvolatile memory comprises a $MgAl_2O_4$ thin film 22 stacked on a Si substrate 21 and a $Bi_2SrTa_2O_9$ thin film 23 stacked on the $MgAl_2O_4$ thin film 22. The $Bi_2SrTa_2O_9$ thin film 23 is a ferroelectric thin film. A $SrRuO_3$ thin film 24 and a $SrRuO_3$ thin film 25 are formed at opposite sides of the $Bi_2SrTa_2O_9$ thin film 23 on the $MgAl_2O_4$ thin film 22 to be in contact with sidewalls of the $Bi_2SrTa_2O_9$ thin film 23. The $SrRuO_3$ thin film 24 and the $SrRuO_3$ thin film 25 behave as electrodes. The specific resistant value of the $SrRuO_3$ thin film 24 and the $SrRuO_3$ thin film 25 is in the range from 200 $\mu\Omega$·cm to 300 $\mu\Omega$·cm which is low enough for use as electrodes. Further stacked on the $Bi_2SrTa_2O_9$ thin film 23, $SrRuO_3$ thin film 24 and $SrRuO_3$ thin film 25 is an insulating cap layer 26.

The Si substrate 21 and the $MgAl_2O_4$ thin film 22 have (100) plane orientation. The $Bi_2SrTa_2O_9$ thin film 23 has (001) plane orientation. The $SrRuO_3$ thin film 24 and the $SrRuO_3$ thin film 25 have (100) plane orientation. The Si substrate 21 may either doped or non-doped with an impurity.

Since the $Bi_2SrTa_2O_9$ thin film 23 has (001) plane orientation, the c-axis of the $Bi_2SrTa_2O_9$ thin film 23 is perpendicular to the substrate surface. Reference numeral 23a denotes a $SrTaO_3$ layer which is a subunit of the $Bi_2SrTa_2O_9$ thin film 23, and 23b denotes a Bi—O layer behaving as a blocking layer.

In the ferroelectric nonvolatile memory, the $MgAl_2O_4$ thin film 22 is in substantially complete lattice matching with the Si substrate 21, and the $Bi_2SrTa_2O_9$ thin film 23, $SrRuO_3$ thin film 24 and $SrRuO_3$ thin film 25 are in substantially complete lattice matching with the $MgAl_2O_4$ thin film 22.

Usable as the material of the insulating cap layer 26 are, for example, $Al_2O_3$, $CeO_2$, and YSZ.

In the third embodiment, orientation of the $Bi_2SrTa_2O_9$ thin film 23 is determined to make the a-axis or b-axis be parallel to the direction of the electric field while making the c-axis be perpendicular to the substrate surface because the $Bi_2SrTa_2O_9$ thin film 23 has the inner layer structure with c-axis orientation like "blocking layer/perovskite layer/blocking layer". It is ideal that the subunit ($SrTaO_3$ layer 23a) generating the ferroelectric polarization in the direction of the electric field (E) appears with an appropriate ratio of thickness relative to the blocking layer (Bi—O layer 23b) in the scale of atomic layers, also from the perspective of the depolarization factor.

Explained below is a method for fabricating the ferroelectric nonvolatile memory having the above-explained arrangement according to the third embodiment.

First epitaxially grown on the Si substrate 21 are the $MgAl_2O_4$ thin film 22 and the $Bi_2SrTa_2O_9$ thin film 23 in sequence. Reactive evaporation, sputtering, laser abrasion, or other like methods can be used for the epitaxial growth. Among them, reactive evaporation is one of evaporation methods for effecting evaporation in a high-oxidizing atmosphere of ozone or active oxygen gas created near the substrate by commonly using resistance heating and electron beam heating, and also called active reactive evaporation (for example, (17) Seramikkusu Ronbunshi, 98, 749–753 (1990)). During deposition of films by reactive evaporation, control of the film thickness in the level of atoms in each unit cell is possible by monitoring RHEED (reflection high energy electron diffraction) vibrations.

After that, the $Bi_2SrTa_2O_9$ thin film 23 is selectively etched into a desired pattern.

Then, the $SrRuO_3$ thin film (not shown) is epitaxially grown on the entire surface. Here again, reactive evaporation, sputtering, laser abrasion, or other like methods can be used for the epitaxial growth. The thickness of the $SrRuO_3$ thin film should be larger at least than the thickness of the $Bi_2SrTa_2O_9$ thin film 23.

After a resist (not shown) is applied on the $SrRuO_3$ thin film to smooth the surface, the resist and the $SrRuO_3$ thin film are etched back vertically to the substrate plane by anisotropic etching. The back etching is stopped when the upper surface of the $Bi_2SrTa_2O_9$ thin film 23 is exposed. As a result, the $SrRuO_3$ 24 thin film and the $SrRuO_3$ 25 thin film in contact with sidewalls of the $Bi_2SrTa_2O_9$ thin film 23 are formed at opposite sides of the $Bi_2SrTa_2O_9$ thin film 23 on the $MgAl_2O_4$ thin film 22.

The insulating cap layer 26 is next grown on the $Bi_2SrTa_2O_9$ thin film 23, $SrRuO_3$ thin film 24 and the $SrRuO_3$ thin film 25. Also for the growth of the insulating cap layer 26, reactive evaporation, sputtering, laser abrasion or other like methods can be used.

Thus, the intended ferroelectric nonvolatile memory is obtained.

Taking the leakage current and the size effect into consideration, using the single crystal $Bi_2SrTa_2O_9$ thin film 23 as the ferroelectric thin film in the third embodiment would be advantageous when the thickness of the ferroelectric thin film decreases around 100 nm to 200 nm.

The ferroelectric nonvolatile memory according to the third embodiment promises the following various advantages. That is, the $SrRuO_3$ thin film 24 and the $SrRuO_3$ thin film 25 used as the electrodes are in good lattice matching with the $MgAl_2O_4$ thin film 22, and the peel-off problem of the electrodes is overcome. Also the fatigue property is good. Since the single crystal $Bi_2SrTa_2O_9$ thin film 23 is used, the leakage current is very small, and degradation of the ferroelectric property of the $Bi_2SrTa_2O_9$ thin film 23 accompanied by the three-dimensional size effect can be prevented, even with a decrease in distance between the electrodes, that is, a decrease in thickness of the $Bi_2SrTa_2O_9$ thin film 23. Then, values near the best polarization values of ferroelectric materials can be utilized.

As described, the third embodiment can realize all-oxides-type ferroelectric nonvolatile memory with excellent characteristics and high reliability by optimizing the structure. This ferroelectric nonvolatile memory is of a planar type, and is suitable for integration.

Figure 14:
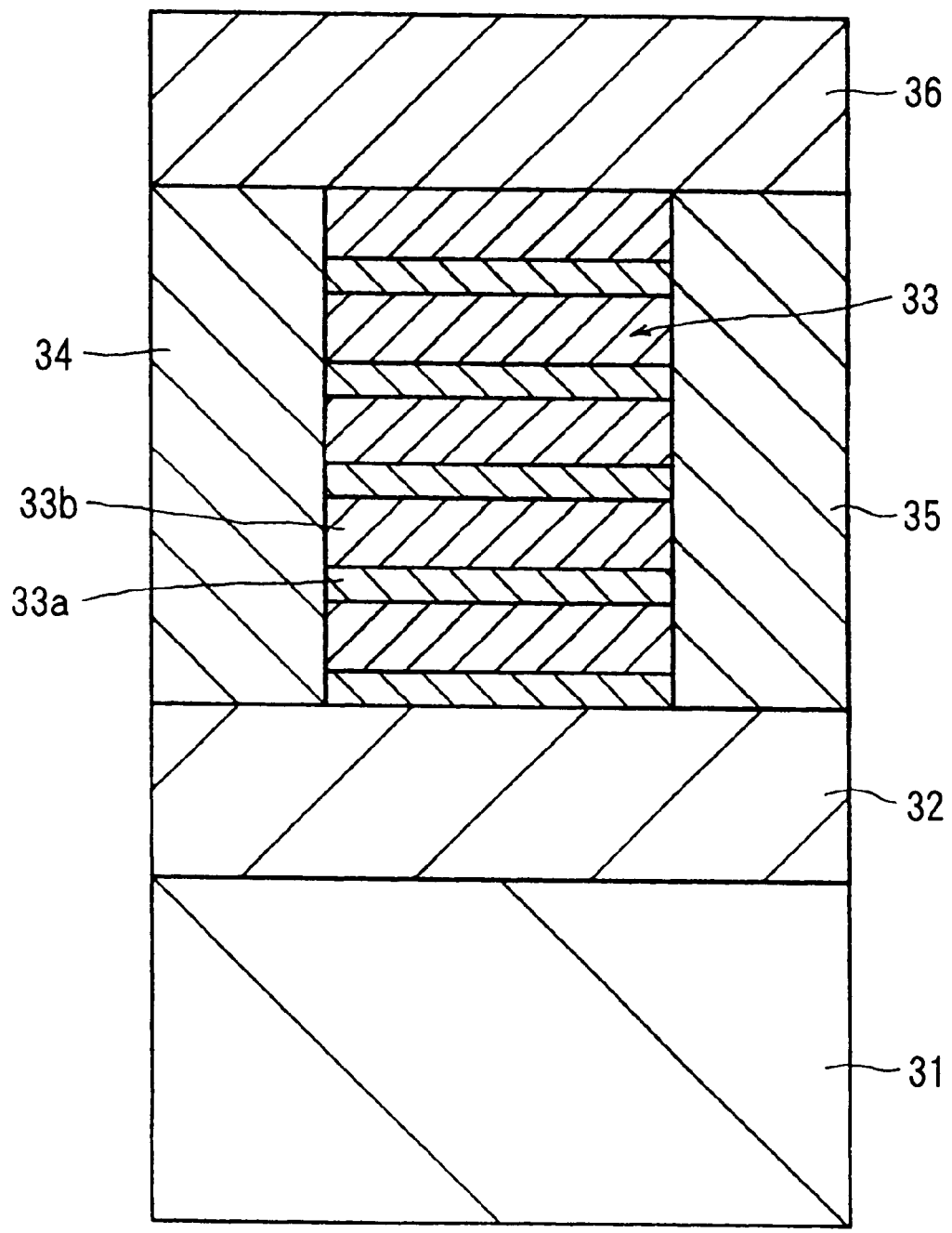
FIG. 14 is a cross-sectional view showing ferroelectric nonvolatile memory according to a fourth embodiment of the invention.

FIG. 14 is a cross-sectional view of ferroelectric nonvolatile memory taken as a fourth embodiment of the invention.

As shown in FIG. 14, the ferroelectric nonvolatile memory comprises a $MgAl_2O_4$ thin film 32 deposited on a Si substrate 31, and a $(PbTiO_3)_n/(Bi_2O_3)_m$ superlattice 33 is deposited on the $MgAl_2O_4$ thin film 32. The $(PbTiO_3)_n/(Bi_2O_3)_m$ superlattice 33 is a ferroelectric thin film. A $SrRuO_3$ thin film 34 and a $SrRuO_3$ thin film 35 are formed at opposite sides of the $(PbTiO_3)_n/(Bi_2O_3)_m$ superlattice 33 on the $MgAl_2O_4$ thin film 32 to be in contact with sidewalls of the $(PbTiO_3)_n/(Bi_2O_3)_m$ superlattice 33. The $SrRuO_3$ thin film 34 and the $SrRuO_3$ thin film 35 behave as electrodes. Further stacked on the $(PbTiO_3)_n/(Bi_2O_3)_m$ superlattice 33, $SrRuO_3$ thin film 34 and $SrRuO_3$ thin film 35 is an insulating cap layer 36.

The Si substrate 31 and the $MgAl_2O_4$ thin film 32 have (100) plane orientation. The $SrRuO_3$ thin film 34 and the $SrRuO_3$ thin film 35 have (100) plane orientation. The Si substrate 31 may either doped or non-doped with an impurity.

In the ferroelectric nonvolatile memory, the $MgAl_2O_4$ thin film 32 is in substantially complete lattice matching with the Si substrate 31, and the $(PbTiO_3)_n/(Bi_2O_3)_m$ superlattice 33, $SrRuO_3$ thin film 34 and $SrRuO_3$ thin film 35 are in substantially complete lattice matching with the $MgAl_2O_4$ thin film 32.

Usable as the material of the insulating cap layer 36 are, for example, $Al_2O_3$, $CeO_2$, and YSZ.

The $(PbTiO_3)_n/(Bi_2O_3)_m$ superlattice 33 is made by alternately stacking paraelectric oxide thin films of $Bi_2O_3$, 33a, and ferroelectric oxide thin films of $PbTiO_3$, 33b. The $Bi_2O_3$ thin films 33a behave as blocking layers. In this case, the $PbTiO_3$ films 33b for performance of the ferroelectric property exhibit (001) plane orientation with their c-axes being normal to the substrate plane immediately after deposition. However, after the ferroelectric nonvolatile memory operates even once, their plane orientation changes to (100) with their c-axes being parallel to the substrate plane (strictly, however, the areas having (100) plane orientation only increase, and the films 33b are not entirely changed to (100) plane orientation). This is advantageous from the viewpoint of the depolarization.

The ferroelectric nonvolatile memory having the above-explained arrangement according to the fourth embodiment can be fabricated by the same method as used for the ferroelectric nonvolatile memory according to the third embodiment, except that the $(PbTiO_3)_n/(Bi_2O_3)_m$ superlattice 33 is grown in lieu of the $Bi_2SrTa_2O_9$ thin film 23.

Thus, the fourth embodiment can realize all-oxides-type ferroelectric nonvolatile memory with excellent characteristics and high reliability as realized by the third embodiment. In particular, since the paraelectric oxide thin films, $Bi_2O_3$ thin films 33a, in the $(PbTiO_3)_n/(Bi_2O_3)_m$ superlattice 33 behave as blocking layers, the ferroelectric property of the ferroelectric oxide thin films, $PbTiO_3$ thin films 33b, is improved remarkably. This ferroelectric nonvolatile memory is of a planar type, and is suitable for integration.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, $SrRuO_3$ thin films used as electrodes in the first, third and fourth embodiments may be replaced with, for example, $Sr_2RuO_4$ thin films. In contrast, $Sr_2RuO_4$ thin films used as electrodes in the second embodiment may be replaced with, for example, $SrRuO_3$ thin films.

Otherwise, $(Nd_{1-x}Ce_x)_2CuO_{4-\delta}$ thin films may be used as electrodes in the first to fourth embodiments.

In conclusion, according to the first aspect of the invention, ferroelectric nonvolatile memory with an optimum structure can be realized by using a silicon substrate, a buffer layer made of an oxide on the silicon substrate, a conductive oxide thin film on the buffer layer, a bismuth-based layered ferroelectric oxide thin film on the conductive oxide thin film, and a conductive layer on the bismuth-based layered ferroelectric oxide thin film.

According to the second aspect of the invention, ferroelectric nonvolatile memory with an optimum structure can be realized by using a silicon substrate, a buffer layer made of an oxide on the silicon substrate, a conductive oxide thin film on the buffer layer, an oxide superlattice formed on the conductive oxide thin film and including at least a ferroelectric oxide thin film, and a conductive layer on the oxide superlattice.

According to the third aspect of the invention, ferroelectric nonvolatile memory with an optimum structure can be realized by using a silicon substrate, a buffer layer made of an oxide on the silicon substrate, a bismuth-based layered ferroelectric oxide thin film on the buffer layer, and a first conductive oxide thin film and a second conductive oxide thin film formed at opposite sides of the bismuth layered ferroelectric oxide thin film on the buffer layer to be in contact with sidewalls of the bismuth layered ferroelectric oxide thin film.

According to the fourth aspect of the invention, ferroelectric nonvolatile memory with an optimum structure can be realized by using a silicon substrate, a buffer layer made of an oxide on the silicon substrate, an oxide superlattice formed on the buffer layer and including at least a ferroelectric oxide thin film, and a first conductive oxide thin film and a second conductive oxide thin film formed at opposite sides of the oxide superlattice on the buffer layer to be in contact with sidewalls of the oxide superlattice.

What is claimed is:

1. A ferroelectric nonvolatile memory comprising:
   a silicon substrate;
   a buffer layer comprised of an oxide on said silicon substrate, said oxide selected from the group consisting of magnesium oxide, cerium oxide, α-alumina, yttrium stabilized zirconia and magnesium aluminate spinel;
   a conductive oxide thin film on said buffer layer, said conductive oxide thin film selected from the group consisting of $SrRuO_3$ and $Sr_2RuO_4$;
   a bismuth-based layered ferroelectric oxide thin film on said conductive oxide thin film; and
   a conductive layer on said bismuth-based layered ferroelectric oxide thin film, wherein said buffer layer is substantially lattice matched with said silicon substrate, said conductive oxide thin film is substantially lattice matched with said buffer layer, and said bismuth-based layered ferroelectric oxide thin film is substantially lattice matched with said conductive oxide thin film, wherein said buffer layer, said conductive oxide thin film and said bismuth-based layered ferroelectric oxide thin film are epitaxially grown on said silicon substrate.

2. The ferroelectric nonvolatile memory according to claim 1, wherein said conductive oxide thin film has a perovskite crystal structure.

3. The ferroelectric nonvolatile memory according to claim 2, wherein said conductive oxide thin film is made of $SrRuO_3$.

4. The ferroelectric nonvolatile memory according to claim 1, wherein said conductive oxide thin film has a layered perovskite crystal structure.

5. The ferroelectric nonvolatile memory according to claim 4, wherein said conductive oxide thin film is made of $Sr_2RuO_4$.

6. The ferroelectric nonvolatile memory according to claim 1, wherein said conductive oxide thin film is made of a high temperature superconducting oxide.

7. The ferroelectric nonvolatile memory according to claim 6, wherein said conductive oxide thin film is made of $(Nd_{1-x}Ce_x)_2CuO_{4-\delta}$.

8. The ferroelectric nonvolatile memory according to claim 2, wherein said buffer layer is made of magnesium aluminum spinel.

9. The ferroelectric nonvolatile memory according to claim 4, wherein said buffer layer is made of magnesium aluminum spinel.

10. The ferroelectric nonvolatile memory according to claim 8, wherein said silicon substrate, said buffer layer and said conductive oxide thin film have (110) plane orientation, and said bismuth-based layered ferroelectric oxide thin film has (100) plane orientation.

11. The ferroelectric nonvolatile memory according to claim 2, wherein said buffer layer is made of cerium oxide.

12. The ferroelectric nonvolatile memory according to claim 4, wherein said buffer layer is made of cerium oxide.

13. The ferroelectric nonvolatile memory according to claim 9, wherein said silicon substrate has (100) or (111) plane orientation, said buffer layer has (110) or (111) plane orientation, said conductive oxide thin film has (110) plane orientation, and said bismuth-based layered ferroelectric oxide thin film has (100) plane orientation.

14. The ferroelectric nonvolatile memory according to claim 1, wherein said conductive layer is a conductive oxide thin film.

15. The ferroelectric nonvolatile memory according to claim 14, wherein said conductive oxide thin film constituting the conductive layer has a perovskite crystal structure.

16. The ferroelectric nonvolatile memory according to claim 15, wherein said conductive oxide thin film constituting the conductive layer is made of $SrRuO_3$.

17. The ferroelectric nonvolatile memory according to claim 14, wherein said conductive oxide thin film constituting the conductive layer has a layered perovskite crystal structure.

18. The ferroelectric nonvolatile memory according to claim 17, wherein said conductive oxide thin film constituting the conductive layer is made of $Sr_2RuO_4$.

19. The ferroelectric nonvolatile memory according to claim 14, wherein said conductive oxide thin film constituting the conductive layer is made of a high temperature superconducting oxide.

20. The ferroelectric nonvolatile memory according to claim 19, wherein said conductive oxide thin film constituting the conductive layer is made of $(Nd_{1-x}Ce_x)_2CuO_{4-\delta}$.

21. A ferroelectric nonvolatile memory comprising:

a silicon substrate;

a buffer layer made of an oxide on said silicon substrate, said oxide selected from the group consisting of magnesium oxide, cerium oxide, $\alpha$-alumina, yttrium stabilized zirconia and magnesium aluminate spinel;

a conductive oxide thin film on said buffer layer, said conductive oxide thin film selected from the group consisting of $SrRuO_3$ and $Sr_2RuO_4$;

an oxide superlattice including at least a ferroelectric oxide thin film on said conductive oxide thin film; and a conductive layer on said oxide superlattice, wherein said buffer layer, said conductive oxide thin film and said oxide superlattice are epitaxially grown on said silicon substrate.

22. The ferroelectric nonvolatile memory according to claim 21, wherein said oxide superlattice comprises a first ferroelectric oxide thin film and a second ferroelectric oxide thin film.

23. The ferroelectric nonvolatile memory according to claim 21, wherein said oxide superlattice comprises a ferroelectric oxide thin film and a paraelectric oxide thin film.

24. The ferroelectric nonvolatile memory according to claim 21, wherein said ferroelectric oxide thin film has a perovskite crystal structure.

25. The ferroelectric nonvolatile memory according to claim 21, wherein said ferroelectric oxide thin film is a bismuth-based layered ferroelectric oxide thin film.

26. The ferroelectric nonvolatile memory according to claim 21, wherein said oxide superlattice has a structure in which artificial crystal including at least a Me—Re—O atomic layer (where Me=Ba, Pb, Sr or Ca, Re=Ti, Zr, Sn, Hf, Ce, Bi, Pb, Nb or Ta) as an intermediate atomic layer inserted between a first Bi—O atomic layer and a second Bi—O atomic layer forms one unit crystal layer in the thickness direction.

27. The ferroelectric nonvolatile memory according to claim 21, wherein said buffer layer is in substantial lattice matching with said silicon substrate, said conductive oxide thin film is in substantial lattice matching with said buffer layer, and said oxide superlattice is in substantial lattice matching with said conductive oxide thin film.

28. The ferroelectric nonvolatile memory according to claim 21, wherein said conductive oxide thin film has a perovskite crystal structure.

29. The ferroelectric nonvolatile memory according to claim 28, wherein said conductive oxide thin film is made of $SrRuO_3$.

30. The ferroelectric nonvolatile memory according to claim 21, wherein said conductive oxide thin film has a layered perovskite crystal structure.

31. The ferroelectric nonvolatile memory according to claim 30, wherein said conductive oxide thin film is made of $Sr_2RuO_4$.

32. The ferroelectric nonvolatile memory according to claim 21, wherein said conductive oxide thin film is made of a high temperature superconducting oxide.

33. The ferroelectric nonvolatile memory according to claim 32, wherein said conductive oxide thin film is made of $(Nd_{1-x}Ce_x)_2CuO_{4-\delta}$.

34. The ferroelectric nonvolatile memory according to claim 28, wherein said buffer layer is made of magnesium aluminum spinel.

35. The ferroelectric nonvolatile memory according to claim 34, wherein said buffer layer is made of magnesium aluminum spinel.

36. The ferroelectric nonvolatile memory according to claim 34, wherein said silicon substrate, said buffer layer and said conductive oxide thin film have (100) plane orientation.

37. The ferroelectric nonvolatile memory according to claim 35, wherein said silicon substrate and said buffer layer have (100) plane orientation, and said conductive oxide thin film has (001) plane orientation.

38. The ferroelectric nonvolatile memory according to claim 36, wherein said oxide superlattice has a perovskite crystal structure, and said oxide thin film has (001) plane orientation.

39. The ferroelectric nonvolatile memory according to claim 37, wherein said oxide superlattice has a perovskite crystal structure, and said oxide thin film has (001) plane orientation.

40. The ferroelectric nonvolatile memory according to claim 36, wherein said oxide superlattice includes a bismuth-based layered ferroelectric oxide thin film, and the bismuth-based layered ferroelectric oxide thin film has (001) plane orientation.

41. The ferroelectric nonvolatile memory according to claim 37, wherein said oxide superlattice includes a bismuth-based layered ferroelectric oxide thin film, and the bismuth-based layered ferroelectric oxide thin film has (001) plane orientation.

42. The ferroelectric nonvolatile memory according to claim 28, wherein said buffer layer is made of cerium oxide.

43. The ferroelectric nonvolatile memory according to claim 30, wherein said buffer layer is made of cerium oxide.

44. The ferroelectric nonvolatile memory according to claim 42, wherein said silicon substrate has (100) plane orientation, said buffer layer has (110) plane orientation, and said conductive oxide thin film has (100) plane orientation.

45. The ferroelectric nonvolatile memory according to claim 43, wherein said silicon substrate has (100) plane orientation, said buffer layer has (110) plane orientation, and said conductive oxide thin film has (001) plane orientation.

46. The ferroelectric nonvolatile memory according to claim 44, wherein said oxide superlattice is an oxide thin film having a perovskite crystal structure, and said oxide thin film has (001) plane orientation.

47. The ferroelectric nonvolatile memory according to claim 45, wherein said oxide superlattice is an oxide thin film having a perovskite crystal structure, and said oxide thin film has (001) plane orientation.

48. The ferroelectric nonvolatile memory according to claim 44, wherein said oxide superlattice includes a bismuth-based layered ferroelectric oxide thin film, and the bismuth-based layered ferroelectric oxide thin film has (001) plane orientation.

49. The ferroelectric nonvolatile memory according to claim 45, wherein said oxide superlattice includes a bismuth-based layered ferroelectric oxide thin film, and the bismuth-based layered ferroelectric oxide thin film has (001) plane orientation.

50. The ferroelectric nonvolatile memory according to claim 21, wherein said conductive layer is a conductive oxide thin film.

51. The ferroelectric nonvolatile memory according to claim 50, wherein said conductive oxide thin film constituting the conductive layer is in substantial lattice matching with said oxide superlattice.

52. The ferroelectric nonvolatile memory according to claim 50, wherein said conductive oxide thin film constituting the conductive layer has a perovskite crystal structure.

53. The ferroelectric nonvolatile memory according to claim 52, wherein said conductive oxide thin film constituting the conductive layer is made of $SrRuO_3$.

54. The ferroelectric nonvolatile memory according to claim 50, wherein said conductive oxide thin film constituting the conductive layer has a layered perovskite crystal structure.

55. The ferroelectric nonvolatile memory according to claim 54, wherein said conductive oxide thin film constituting the conductive layer is made of $Sr_2RuO_4$.

56. The ferroelectric nonvolatile memory according to claim 50, wherein said conductive oxide thin film constituting the conductive layer is made of a high temperature superconducting oxide.

57. The ferroelectric nonvolatile memory according to claim 56, wherein said conductive oxide thin film constituting the conductive layer is made of $(Nd_{1-x}Ce_x)_2CuO_{4-\delta}$.

58. A ferroelectric nonvolatile memory comprising:
    a silicon substrate;
    a buffer layer made of an oxide on said silicon substrate, said oxide selected from the group consisting of magnesium oxide, cerium oxide, α-alumina, yttrium stabilized zirconia and magnesium aluminate spinel;
    a bismuth-based layered ferroelectric oxide thin film on said buffer layer; and
    a first conductive oxide thin film and a second conductive oxide thin film on said buffer layer at opposite sides of said bismuth-based layered ferroelectric oxide thin film and in contact with sidewalls of said bismuth-based layered ferroelectric oxide thin film, wherein said buffer layer, said bismuth-based layered ferroelectric oxide thin film and said first and second conductive oxide thin films are epitaxially grown on said silicon substrate, said conductive oxide thin films selected from the group consisting of $SrRuO_3$ and $Sr_2RuO_4$.

59. The ferroelectric nonvolatile memory according to claim 58, wherein said buffer layer is in substantial lattice matching with said silicon substrate, said bismuth-based layered ferroelectric oxide thin film is in substantial lattice matching with said buffer layer, and said first and second conductive oxide thin films are in substantial lattice matching with said buffer layer.

60. The ferroelectric nonvolatile memory according to claim 58, wherein said first conductive oxide thin film and said second conductive oxide thin film have a perovskite crystal structure.

61. The ferroelectric nonvolatile memory according to claims, wherein said first conductive oxide thin film and said second conductive oxide thin film are made of $SrRuO_3$.

62. The ferroelectric nonvolatile memory according to claim 58, wherein said first conductive oxide thin film and said second conductive oxide thin film have a layered perovskite crystal structure.

63. The ferroelectric nonvolatile memory according to claim 62, wherein said first conductive oxide thin film and said second conductive oxide thin film are made of $Sr_2RuO_4$.

64. The ferroelectric nonvolatile memory according to claim 58, wherein said conductive oxide thin films are made of a high temperature superconducting oxide.

65. The ferroelectric nonvolatile memory according to claim 64, wherein said conductive oxide thin films are made of $(Nd_{1-x}Ce_x)_2CuO_{4-\delta}$.

66. The ferroelectric nonvolatile memory according to claim 60, wherein said buffer layer is made of magnesium aluminum spinel.

67. The ferroelectric nonvolatile memory according to claim 62, wherein said buffer layer is made of magnesium aluminum spinel.

68. The ferroelectric nonvolatile memory according to claim 66, wherein said silicon substrate, said buffer layer, said first conductive oxide thin film and said second conductive oxide thin film have (100) plane orientation, and said bismuth-based layered ferroelectric oxide thin film has (001) plane orientation.

69. The ferroelectric nonvolatile memory according to claim 67, wherein said silicon substrate and said buffer layer have (100) plane orientation, and said bismuth-based layered ferroelectric oxide thin film, said first conductive oxide thin film and said second conductive oxide thin film have (001) plane orientation.

70. The ferroelectric nonvolatile memory according to claim 60, wherein said buffer layer is made of cerium oxide.

71. The ferroelectric nonvolatile memory according to claim 62, wherein said buffer layer is made of cerium oxide.

72. The ferroelectric nonvolatile memory according to claim 70, wherein said silicon substrate has (100) plane orientation, said buffer layer has (110) plane orientation, said bismuth-based layered ferroelectric oxide thin film has (001) plane orientation, and said first conductive oxide thin film and said second conductive oxide thin film have (100) plane orientation.

73. The ferroelectric nonvolatile memory according to claim 71, wherein said silicon substrate has (100) plane orientation, said buffer layer has (110) plane orientation, and said bismuth-based layered ferroelectric oxide thin film, said first conductive oxide thin film and said second conductive oxide thin film have (001) plane orientation.

74. The ferroelectric nonvolatile memory according to claim 58, further comprising an insulating cap layer lying over said bismuth-based layered ferroelectric oxide thin film, said first conductive oxide thin film and said second conductive oxide thin film.

75. A ferroelectric nonvolatile memory comprising:
a silicon substrate;
a buffer layer made of an oxide on said silicon substrate, said oxide selected from the group consisting of magnesium oxide, cerium oxide, α-alumina, yttrium stabilized zirconia and magnesium aluminate spinel;
an oxide superlattice including at least a ferroelectric oxide thin film on said buffer layer; and
a first conductive oxide thin film and a second conductive oxide thin film on said buffer layer at opposite sides of said oxide superlattice and in contact with sidewalls of said oxide superlattice, wherein said buffer layer, said oxide superlattice, said first conductive oxide thin film and said second conductive oxide thin film are epitaxially grown on said silicon substrate, said conductive oxide thin films selected from the group consisting of $SrRuO_3$ and $Sr_2RuO_4$.

76. The ferroelectric nonvolatile memory according to claim 75, wherein said oxide superlattice comprises a ferroelectric oxide thin film and a paraelectric oxide thin film.

77. The ferroelectric nonvolatile memory according to claim 75, wherein said ferroelectric oxide thin film has a perovskite crystal structure.

78. The ferroelectric nonvolatile memory according to claim 75, wherein said ferroelectric oxide thin film is a bismuth layered ferroelectric oxide thin film.

79. The ferroelectric nonvolatile memory according to claim 75, wherein said oxide superlattice has a structure in which artificial crystal including at least a Me—Re—O atomic layer (where Me=Ba, Pb, Sr or Ca, Re=Ti, Zr, Sn, Hf, Ce, Bi, Pb, Nb or Ta) as an intermediate atomic layer inserted between a first Bi—O atomic layer and a second Bi—O atomic layer forms one unit crystal layer in the thickness direction.

80. The ferroelectric nonvolatile memory according to claim 75, wherein said buffer layer is in substantial lattice matching with said silicon substrate, said oxide superlattice is in substantial lattice matching with said buffer layer, and said first and second conductive oxide thin films are in substantial lattice matching with said buffer layer.

81. The ferroelectric nonvolatile memory according to claim 75, wherein said first conductive oxide thin film and said second conductive oxide thin film have a perovskite crystal structure.

82. The ferroelectric nonvolatile memory according to claim 81, wherein said first conductive oxide thin film and said second conductive oxide thin film are made of $SrRuO_3$.

83. The ferroelectric nonvolatile memory according to claim 75, wherein said first conductive oxide thin film and said second conductive oxide thin film have a layered perovskite crystal structure.

84. The ferroelectric nonvolatile memory according to claim 83, wherein said first conductive oxide thin film and said second conductive oxide thin film are made of $Sr_{RuO4}$.

85. The ferroelectric nonvolatile memory according to claim 75, wherein said conductive oxide thin films are made of a high temperature superconducting oxide.

86. The ferroelectric nonvolatile memory according to claim 85, wherein said conductive oxide thin films are made of $(Nd_{1-x}Ce_x)_2CuO_{4-\delta}$.

87. The ferroelectric nonvolatile memory according to claim 81, wherein said buffer layer is made of magnesium aluminum spinel.

88. The ferroelectric nonvolatile memory according to claim 83, wherein said buffer layer is made of magnesium aluminum spinel.

89. The ferroelectric nonvolatile memory according to claim 87, wherein said silicon substrate, said buffer layer, said first conductive oxide thin film and said second conductive oxide thin film have (100) plane orientation.

90. The ferroelectric nonvolatile memory according to claim 89, wherein said ferroelectric oxide thin film constituting the oxide superlattice has a perovskite crystal structure and has (100) plane orientation.

91. The ferroelectric nonvolatile memory according to claim 89, wherein said ferroelectric oxide thin film constituting the oxide superlattice is a bismuth-based layered ferroelectric oxide thin film, and the bismuth-based layered ferroelectric oxide thin film has (001) plane orientation.

92. The ferroelectric nonvolatile memory according to claim 88, wherein said silicon substrate and said buffer layer have (100) plane orientation, and said first conductive oxide film and said second conductive oxide thin film have (001) plane orientation.

93. The ferroelectric nonvolatile memory according to claim 92, wherein said ferroelectric oxide thin film constituting the oxide superlattice has a perovskite crystal structure and has (001) plane orientation.

94. The ferroelectric nonvolatile memory according to claim 92, wherein said ferroelectric oxide thin film constituting the oxide superlattice is a bismuth-based layered ferroelectric oxide thin film, and the bismuth-based layered ferroelectric oxide thin film has (001) plane orientation.

95. The ferroelectric nonvolatile memory according to claim 81, wherein said buffer layer is made of cerium oxide.

96. The ferroelectric nonvolatile memory according to claim 83, wherein said buffer layer is made of cerium oxide.

97. The ferroelectric nonvolatile memory according to claim 95, wherein said silicon substrate has (100) plane orientation, said buffer layer has (110) plane orientation, and said first conductive oxide thin film and said second conductive oxide thin film have (100) plane orientation.

98. The ferroelectric nonvolatile memory according to claim 97, wherein said ferroelectric oxide thin film constituting the oxide superlattice has a perovskite crystal structure and has (001) plane orientation.

99. The ferroelectric nonvolatile memory according to claim 97, wherein said ferroelectric oxide thin film constituting the oxide superlattice is a bismuth-based layered ferroelectric oxide thin film, and the bismuth-based layered ferroelectric oxide thin film has (001) plane orientation.

100. The ferroelectric nonvolatile memory according to claim 96, wherein said silicon substrate has (100) plane orientation, said buffer layer has (110) plane orientation, and said first and second conductive oxide thin films have (001) plane orientation.

101. The ferroelectric nonvolatile memory according to claim 98, wherein said ferroelectric oxide thin film constituting the oxide superlattice has a perovskite crystal structure and has (001) plane orientation.

102. The ferroelectric nonvolatile memory according to claim 98, wherein said ferroelectric oxide thin film constituting the oxide superlattice is a bismuth-based layered ferroelectric oxide thin film, and the bismuth-based layered ferroelectric oxide thin film has (001) plane orientation.

103. The ferroelectric nonvolatile memory according to claim 75, further comprising an insulating cap layer lying over said oxide superlattice, said first conductive oxide thin film and said second conductive oxide thin film.

104. An oxide multi-layered structure comprising:

a silicon substrate;

a buffer layer made of an oxide on said silicon substrate, said oxide selected from the group consisting of cerium oxide and magnesium aluminate spinel; and a conductive oxide thin film on said buffer layer, said conductive oxide thin film selected from the group consisting of $SrRuO_3$ and $Sr_2RuO_4$.

* * * * *